United States Patent
Shibata et al.

(10) Patent No.: US 10,211,921 B2
(45) Date of Patent: Feb. 19, 2019

(54) OPTICAL COMMUNICATION SYSTEM AND OPTICAL COMMUNICATION METHOD

(71) Applicant: NIPPON TELEGRAPH AND TELEPHONE CORPORATION, Tokyo (JP)

(72) Inventors: Naotaka Shibata, Yokosuka (JP); Shigeru Kuwano, Yokosuka (JP); Yutaka Kamamoto, Atsugi (JP); Takehiro Moriya, Atsugi (JP); Jun Terada, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/572,636

(22) PCT Filed: Apr. 6, 2016

(86) PCT No.: PCT/JP2016/061261
§ 371 (c)(1),
(2) Date: Nov. 8, 2017

(87) PCT Pub. No.: WO2016/185820
PCT Pub. Date: Nov. 24, 2016

(65) Prior Publication Data
US 2018/0138979 A1    May 17, 2018

(30) Foreign Application Priority Data

May 19, 2015  (JP) .................................. 2015-101839

(51) Int. Cl.
*H04J 14/00*  (2006.01)
*H04B 10/2575*  (2013.01)
(Continued)

(52) U.S. Cl.
CPC .......... *H04B 10/2575* (2013.01); *H03M 7/30* (2013.01); *H04J 11/00* (2013.01); *H04L 27/2628* (2013.01)

(58) Field of Classification Search
CPC .......... H04B 10/2575; H04B 10/25753; H04B 10/25754; H04B 10/25759; H04B 10/60;
(Continued)

(56) References Cited

U.S. PATENT DOCUMENTS

2009/0207836 A1  8/2009 Kawasaki et al.
2012/0250740 A1  10/2012 Ling
(Continued)

FOREIGN PATENT DOCUMENTS

CN  101604523 A  12/2009
JP  2011-526095 A  9/2011
(Continued)

OTHER PUBLICATIONS

CPRI, "CPRI Specification V6.0", Aug. 2013, http://www.cpri.info/spec.html.
(Continued)

*Primary Examiner* — Hanh Phan
(74) *Attorney, Agent, or Firm* — Harness, Dickey & Pierce, P.L.C.

(57) ABSTRACT

An optical communication system includes a signal processing apparatus and a wireless apparatus between which functions of a base station are divided, wherein a periodic symbol sequence including a cyclic prefix appended to a signal of a predetermined size to which an IFFT (Inverse Fast Fourier Transform) has been applied is transmitted between the signal processing apparatus and the wireless apparatus by means of digital RoF (Radio over Fiber) transmission, the signal processing apparatus and the wireless apparatus each include a transmission unit and a recep-
(Continued)

tion unit, the transmission unit includes: a first separation unit that acquires symbol information relating to a starting position of the symbol sequence and lengths of symbols constituting the symbol sequence, and that equalizes the lengths of the symbols by separating a portion of the symbol sequence based on the acquired symbol information; and a compression unit that compresses symbols that are to be compressed from which the separated portion of the symbol sequence has been removed, and the reception unit includes an expansion unit that expands the compressed symbols and restores the symbols.

7 Claims, 23 Drawing Sheets

(51) Int. Cl.
   *H03M 7/30* (2006.01)
   *H04J 11/00* (2006.01)
   *H04L 27/26* (2006.01)

(58) Field of Classification Search
   CPC .. H04W 88/08; H04W 88/085; H04W 72/042
   USPC ... 398/66, 67, 68, 72, 98, 99, 100, 115, 116, 398/158, 159, 135, 136, 76, 79, 70, 71; 370/328, 329, 352, 392, 389, 468, 465; 455/501, 509, 507, 445
   See application file for complete search history.

(56) References Cited

U.S. PATENT DOCUMENTS

| | | | |
|---|---|---|---|
| 2013/0321181 | A1 | 12/2013 | Cheng et al. |
| 2015/0229397 | A1* | 8/2015 | Shibata ............ H04B 10/25754 398/115 |
| 2016/0128085 | A1* | 5/2016 | Liu ......................... H04J 14/00 398/96 |

FOREIGN PATENT DOCUMENTS

| | | |
|---|---|---|
| JP | 2013-251895 A | 12/2013 |
| JP | 2014-099679 A | 5/2014 |
| JP | 2015-056736 A | 3/2015 |
| WO | WO-2009/151893 A2 | 12/2009 |

OTHER PUBLICATIONS

Yutaka Kamamoto, Takehiro Moriya, Noboru Harada, Csaba Kos, "Enhancement of MPEG-4 ALS Lossless Audio Coding", NTT Technical Journal, Feb. 2008, with translation thereof.

Erik Dahlman et al. (authors), Takeshi Hattori et al. (translation supervision),"3G Evolution Second edition HSPA and LTE for Mobile Broadband", Dec. 2009,pp. 356, 425, with partial translation thereof.

Yasuo Suzuki et al., "Data Compression of Digitized Radio-on-Fiber (DRoF) System for Wide-Area Ubiquitous Network", Proceedings of the 2006 IEICE Communications Society Conference 1, Sep. 7, 2006 (Sep. 7, 2006), p. 472.

Naotaka Shibata et al., "Data Compression Technique using Wireless Resource Allocation for Mobile Fronthaul with TDM-PON", IEICE Technical Report, vol. 113, No. 390, Jan. 16, 2014 (Jan. 16, 2014), pp. 51 to 56, with abstract.

International Search Report for PCT/JP2016/061261, ISA/JP, Tokyo, dated Jun. 21, 2016, with English translation attached.

Chinese Office Action in parallel application CN 201680028445.8, SIPO, dated Jul. 20, 2018, with partial English translation of Search Report.

Extended European Search Report in related application EP 16796214.1 EPO, Munich, dated Nov. 30, 2018.

* cited by examiner

Prior Art

Prior Art

FIG. 22

|       | FRAME NUMBER | COMPRESSION RATE |
|-------|--------------|------------------|
| (a)   | 1            | 0.690693         |
|       | 2            | 0.691606         |
|       | 3            | 0.677007         |
|       | 4            | 0.686131         |
| (b)   | 5            | 0.79927          |
|       | 6            | 0.687044         |
| (c)   | 7            | 0.691606         |
|       | 8            | 0.688869         |
| (d)   | 9            | 0.763686         |
|       | 10           | 0.687956         |
| (e)   | 11           | 0.691606         |
|       | 12           | 0.694343         |
| (f)   | 13           | 0.818431         |
|       | 14           | 0.687956         |
| (g)   | 15           | 0.679745         |
|       | 16           | 0.683394         |
| (h)   | 17           | 0.779197         |
|       | 18           | 0.686131         |
| (i)   | 19           | 0.685219         |
|       | 20           | 0.685219         |
| (j)   | 21           | 0.781022         |
|       | 22           | 0.69708          |

Prior Art

OPTICAL COMMUNICATION SYSTEM AND OPTICAL COMMUNICATION METHOD

CROSS-REFERENCE TO RELATED APPLICATIONS

This application is a 371 U.S. National Stage of International Application No. PCT/JP2016/061261, filed Apr. 6, 2016. This application claims the benefit of and priority to Japanese Patent Application No. 2015-101839, filed May 19, 2015. The disclosures of the above applications are incorporated herein by reference.

TECHNICAL FIELD

The present invention relates to digital RoF (Radio over Fiber) transmission technology.

BACKGROUND ART

Conventionally, in order to improve the level of freedom of cell architecture in cellular systems, configurations in which the functions of a base station apparatus are divided between a signal processing unit (hereinafter referred to as "BBU" (BaseBand Unit)) and an RF unit (hereinafter referred to as "RRH" (Remote Radio Head)), and the BBU and the RRH are physically separated, have been considered. In such a configuration, the wireless signals transmitted between the BBU and the RRH are transmitted by means of RoF technology. RoF technologies can be largely divided between analog RoF technologies and digital RoF technologies, depending on the optical transmission method. In recent years, the study of digital RoF technologies having superior transmission quality has flourished, and standardization organizations such as the CPRI (Common Public Radio Interface) and the like are working towards the establishment of specifications (see, e.g., Non-patent Document 1). Additionally, while coaxial cable, optical fiber, and the like can be used as the connecting media between BBUs and RRHs, the transmission distance can be extended, in particular, by using optical fiber to connect BBUs and RRHs.

Herebelow, digital RoF transmission will be explained.

In discussing digital RoF transmission, the following terminology will be defined.

A downlink refers to the communication path of radio waves transmitted from a BBU, via an RRH, to a wireless terminal connected to the RRH.

An uplink refers to the communication path of radio waves transmitted from a wireless terminal connected to an RRH, via the RRH, to a BBU.

On a digital RoF transmission downlink, the following processes are performed. A BBU prepares a digital signal (hereinafter referred to as "IQ data") separately for the I-axis and Q-axis components of a wireless signal, converts the prepared IQ data into an optical signal, and transmits the converted optical signal to an RRH via an optical fiber. The RRH converts the received optical signal into a wireless signal, and transmits the converted wireless signal to a wireless terminal.

Additionally, on a digital RoF transmission uplink, the following processes are performed. An RRH receives a wireless signal transmitted from a wireless terminal, converts the received wireless signal into an optical signal, and transmits the converted optical signal to a BBU via an optical fiber. The BBU converts the received optical signal into IQ data and demodulates the signal.

FIG. 17 is a schematic block diagram illustrating the functional structure of an RRH 500 during digital RoF transmission.

The RRH 500 includes an antenna 501, a transmission/reception switching unit 502, an amplifier 503, a down-conversion unit 504, an A/D (Analog/Digital) conversion unit 505, a baseband filter unit 506, a framing unit 507, an E/O (Electric/Optic) conversion unit 508, an O/E (Optic/Electric) conversion unit 509, a deframing unit 510, a baseband filter unit 511, a D/A (Digital/Analog) conversion unit 512, an up-conversion unit 513, and an amplifier 514.

The antenna 501 transmits and receives wireless signals. The transmission/reception switching unit 502 switches the antenna 501 between transmission and reception. The amplifier 503 amplifies the signal power of a received wireless signal to a level that allows for signal processing. The down-conversion unit 504 down-converts the amplified wireless signal into the baseband. The A/D conversion unit 505 converts the down-converted wireless signal (analog signal) into IQ data, which is a digital signal. The baseband filter unit 506 performs a filtering process on the IQ data. The framing unit 507 performs framing by multiplexing the filtered IQ data with a control signal. The E/O conversion unit 508 converts the framed signal (hereinafter referred to as the "frame signal") (electrical signal) into an optical signal, and transmits the converted optical signal to the BBU via an optical fiber 550.

The O/E conversion unit 509 converts an optical signal received via the optical fiber 550 into a frame signal (electrical signal). The deframing unit 510 extracts a control signal and IQ data from the frame signal. The baseband filter unit 511 performs a filtering process on the IQ data. The D/A conversion unit 512 converts the filtered IQ data into an analog signal. The up-conversion unit 513 up-converts the analog signal. The amplifier 514 amplifies the power of the analog signal to a predetermined transmission power.

FIG. 18 is a schematic block diagram illustrating the functional structure of a BBU 600 during digital RoF transmission.

The BBU 600 includes an O/E conversion unit 601, a deframing unit 602, a modulation/demodulation unit 603, a framing unit 604, and an E/O conversion unit 605.

The O/E conversion unit 601 converts an optical signal received via an optical fiber 650 into a frame signal (electrical signal). The deframing unit 602 extracts a control signal and IQ data from the frame signal. The modulation/demodulation unit 603 restores a wireless signal by demodulating the IQ data. Additionally, the modulation/demodulation unit 603 outputs the IQ data of the wireless signal to the framing unit 604. The framing unit 604 performs framing by multiplexing the IQ data with a control signal. The E/O conversion unit 605 converts the frame signal (electrical signal) into an optical signal and transmits the converted optical signal to the RRH 500 via the optical fiber 650.

Digital RoF transmission requires an extremely broad band in the optical fiber section. For example, in an LTE (Long Term Evolution) system, the wireless signals in a 2×2 MIMO (Multiple-Input and Multiple-Output) with a system bandwidth of 20 MHz have a maximum data rate of 150 Mbps in the wireless section. However, in order to transmit these wireless signals at a 15-bit quantization bit rate, a CPRI link of option 3 (2.4576 Gbps) or greater is needed. Therefore, the application of compression technologies to digital RoF transmission is being studied in order to make effective use of the optical band. Compression techniques can be largely divided between lossy compression and lossless compression. Lossy compression includes reduction of the sampling frequency, reduction of the quantization bit rate, or the like. Lossless compression includes a combination of linear predictive coding and entropy coding or the like. For example, when raising the transmission rate in the wireless section, the required transmission band in the optical section will also increase, but the increased speed in the wireless section can be handled without changing the optical transceiver if the required transmission band in the optical section is reduced by compression technology. For example, Non-patent Document 2 discusses MPEG-4 ALS (Moving Picture Experts Group-4 Audio Lossless Coding), which is a lossless compression technique.

FIG. 19 is a schematic block diagram illustrating the functional structure of an RRH 500a when incorporating compression technology during multiplexed transmission.

The RRH 500a includes an antenna 501, a transmission/reception switching unit 502, an amplifier 503, a down-conversion unit 504, an A/D conversion unit 505, a baseband filter unit 506, a compression unit 701, a framing unit 507a, an E/O conversion unit 508, an O/E conversion unit 509, a deframing unit 510, an expansion unit 702, a baseband filter unit 511a, a D/A conversion unit 512, an up-conversion unit 513, and an amplifier 514.

The compression unit 701 compresses filtered IQ data. The framing unit 507a performs framing by multiplexing the compressed IQ data with a control signal. The expansion unit 702 restores the IQ data by decompressing the compressed IQ data. The baseband filter unit 511a performs a filtering process on the restored IQ data. FIG. 20 is a schematic block diagram illustrating the functional structure of a BBU 600a when incorporating compression technology during multiplexed transmission.

The BBU 600a includes an O/E conversion unit 601, a deframing unit 602, an expansion unit 801, a modulation/demodulation unit 603a, a compression unit 802, a framing unit 604a, and an E/O conversion unit 605.

The expansion unit 801 restores IQ data by decompressing compressed IQ data. The modulation/demodulation unit 603a restores a wireless signal by demodulating the restored IQ data. Additionally, the modulation/demodulation unit 603a outputs the IQ data of the wireless signal to the compression unit 802. The compression unit 802 compresses the IQ data. The framing unit 604a performs framing by multiplexing the compressed IQ data with a control signal.

Among compression technologies, there are those in which a compression process and an expansion process are performed for every predetermined number of samples. In the following explanation, the units for performing the compression process will be referred to as frames, and the predetermined number of samples will be referred to as the frame size. For example, in compression technologies using linear predictive coding, a predicted value is obtained by multiplying coefficients by a number of sample points that are older than a given sample point and adding the multiplication results, and the error between the predicted value and the given sample point is outputted. If the prediction accuracy is high, then the amplitude value of the error signal will be close to zero. For this reason, the required band in the optical section can be reduced by entropy coding for transmitting data at a lower bit rate for amplitude values near zero, which have a higher probability of occurrence. It is to be noted that the coefficients are determined separately for each frame, and calculated so that the prediction error will be small for the IQ data in each frame.

Next, LTE wireless signals will be explained.

In LTE, OFDM (Orthogonal Frequency Division Multiplexing) is used in the downlink. As the time waveform, a signal having a cyclic prefix appended to a signal of a predetermined size that has been subjected to an IFFT (Inverse Fast Fourier Transform) is periodically outputted. On the other hand, in LTE, DFT-S-OFDM (Discrete Fourier Transform-Spread-OFDM) is used in the uplink. In this case also, as with OFDM, a signal having a cyclic prefix appended to a signal of a predetermined size that has been subjected to an IFFT is periodically outputted as the time waveform. In the following explanation, a signal having a cyclic prefix appended to a signal that has been subjected to an IFFT will be referred to as an OFDM symbol, without making a distinction between the downlink and the uplink.

In LTE, a normal cyclic prefix and an extended cyclic prefix are defined. A normal cyclic prefix is shorter than an extended cyclic prefix, and has higher frequency utilization efficiency. For this reason, normal cyclic prefixes are normally used, and in the following description, normal cyclic prefixes will be explained as an example. FIG. 21 illustrates the structure of time slots in LTE. In the example shown in FIG. 21, seven OFDM symbols are arranged in a 0.5 ms interval. If the system bandwidth is 20 MHz, then the IFFT size is 2048, the size of the cyclic prefix (CP1) of the first OFDM symbol is 160 points and the size of the cyclic prefix (CP2) of the second to seventh OFDM symbols is 144 points. Therefore, the OFDM symbol length is 2208 points for the first OFDM symbol and 2192 points for the second to seventh OFDM symbols. Thus, the OFDM symbol lengths are not all the same. Non-patent Document 3 describes the structure of LTE frames.

FIG. 22 is a diagram illustrating the compression rate for each frame when applying MPEG4-ALS to the data in the I component of a wireless signal.

In FIG. 22, the frame number represents the order in which the frames were compressed. The compression rate is the ratio of the data amount after compression to the original data amount. The wireless signal was OFDM-modulated using 1200 subcarriers with a subcarrier spacing of 15 kHz, modulated by 256 QAM (Quadrature Amplitude Modulation), with cyclic prefixes that were 160 samples (first OFDM symbol) or 144 samples (second to seventh OFDM symbols) long. In other words, it was assumed that the entire wireless band was used for data transmission in an LTE downlink system with a system bandwidth of 20 MHz. The frame size was 548.

In FIG. 22, (a) indicates the compression rate when only the first OFDM symbol is contained in a frame. (b) indicates the compression rate when the first OFDM symbol and the second OFDM symbol are contained in a frame. (c) indicates the compression rate when only the second OFDM symbol is contained in a frame. (d) indicates the compression rate when the second OFDM symbol and the third OFDM symbol are contained in a frame. (e) indicates the compression rate when only the third OFDM symbol is contained in a frame. (f) indicates the compression rate when the third OFDM symbol and the fourth OFDM symbol are contained in a frame. (g) indicates the compression rate when only the fourth OFDM symbol is contained in a frame. (h) indicates the compression rate when the fourth OFDM symbol and the fifth OFDM symbol are contained in a frame. (i) indicates the compression rate when only the fifth OFDM symbol is contained in a frame. (j) indicates the compression rate when the fifth OFDM symbol and the sixth OFDM symbol are contained in a frame.

PRIOR ART DOCUMENTS

Non-Patent Documents

Non-patent Document 1: CPRI, "CPRI Specification V6.0", August 2013, http://www.cpri.info/spec.html Non-patent Document 2: Yutaka Kamamoto, Takehiro Moriya, Noboru Harada, Csaba Kos, "Enhancement of MPEG-4 ALS Lossless Audio Coding", NTT Technical Journal, February 2008

Non-patent Document 3: Erik Dahlman et al. (authors), Takeshi Hattori et al. (translation supervision), "3G Evolution Second edition HSPA and LTE for Mobile Broadband", December 2009, pp. 356, 425

SUMMARY OF INVENTION

Problems to be Solved by Invention

As shown in FIG. 22, the compression rate when a compression process is performed without including multiple kinds of OFDM symbols is less than 0.7, while the compression rate when a compression process is performed while including multiple kinds of OFDM symbols always exceeds 0.7. In other words, when performing a compression process while including multiple kinds of OFDM symbols, the compression rate becomes worse than for the case in which the compression process is performed within only one OFDM symbol. This is believed to be due to the fact that the prediction accuracy becomes lower because the frequency components are different and the signal properties differ between OFDM symbols. Thus, with conventional technologies, there is a problem in that the compression rate becomes worse due to compression processes being performed while including multiple kinds of OFDM symbols.

In view of the above-described circumstances, an object of the present invention is to provide a technology that can reduce the worsening of the compression rate.

Means for Solving the Problems

An aspect of the present invention is an optical communication system including: a signal processing apparatus; and a wireless apparatus, in which functions of a base station are divided between the signal processing apparatus and the wireless apparatus, a periodic symbol sequence including a cyclic prefix appended to a signal of a predetermined size to which an IFFT (Inverse Fast Fourier Transform) has been applied is transmitted between the signal processing apparatus and the wireless apparatus by means of digital RoF (Radio over Fiber) transmission, the signal processing apparatus and the wireless apparatus each includes a transmission unit and a reception unit, the transmission unit includes: a first separation unit that acquires symbol information relating to a starting position of the symbol sequence and lengths of symbols constituting the symbol sequence and that equalizes the lengths of the symbols by separating a portion of the symbol sequence based on the acquired symbol information; and a compression unit that compresses symbols that are to be compressed from which the separated portion of the symbol sequence has been removed, and the reception unit includes an expansion unit that expands the compressed symbols and restores the symbols.

In the above-mentioned optical communication system, the transmission unit may further include a first multiplexing unit that multiplexes the separated portion of the symbol sequence with the compressed symbols, and the reception unit may further include: a second separation unit that separates a portion of a multiplexed symbol sequence; and a second multiplexing unit that multiplexes the portion of the symbol sequence separated by the second separation unit with the symbols restored by the expansion unit.

In the above-mentioned optical communication system, the transmission unit may further include a local symbol sequence compression unit that compresses the separated portion of the symbol sequence, and the reception unit may further include a local symbol sequence expansion unit that expands the separated portion of the symbol sequence.

In the above-mentioned optical communication system, the first separation unit may discard the separated portion of the symbol sequence, and the reception unit may further include a signal restoration unit that restores the portion of the symbol sequence discarded by the first separation unit.

In the above-mentioned optical communication system, the compression unit may include a compression rate measurement unit that measures a compression rate for each of the symbols, and the first separation unit may acquire, as the starting position, a position of a symbol at which a predetermined statistical value of measured compression rates is smallest and equalize the lengths of the symbols by separating a portion of the symbol sequence using the acquired starting position and information regarding the lengths of the symbols.

In the above-mentioned optical communication system, the transmission unit may further include a symbol information estimation unit that estimates the starting position based on IQ data for a downlink or for an uplink.

An aspect of the present invention is an optical communication method in an optical communication system including a signal processing apparatus and a wireless apparatus between which functions of a base station are divided, the signal processing apparatus and the wireless apparatus each including a transmission unit and a reception unit, a periodic symbol sequence including a cyclic prefix appended to a signal of a predetermined size to which an IFFT (Inverse Fast Fourier Transform) has been applied being transmitted between the signal processing apparatus and the wireless apparatus by means of digital RoF (Radio over Fiber) transmission, the optical communication method including: a first separation step, performed by the transmission unit, of acquiring symbol information relating to a starting position of the symbol sequence and lengths of symbols constituting the symbol sequence and equalizing the lengths of the symbols by separating a portion of the symbol sequence based on the acquired symbol information; a compression step, performed by the transmission unit, of compressing symbols that are to be compressed from which the separated portion of the symbol sequence has been removed; and an expansion step, performed by the reception unit, of expanding the compressed symbols and restoring the symbols.

Advantageous Effects of Invention

Due to the present invention, it is possible to reduce the worsening of the compression rate.

BRIEF DESCRIPTION OF DRAWINGS

FIG. 22 is a diagram showing the compression rate for each frame when applying MPEG-4 ALS to the I component data in a wireless signal.

MODES FOR CARRYING OUT THE INVENTION

Herebelow, embodiments of the present invention will be explained with reference to the drawings.

Summary

According to the present invention, in an optical communication system including an RRH (wireless apparatus) and a BBU (signal processing apparatus) between which the functions of a base station are divided, the RRH and the BBU acquire information (hereinafter referred to as "OFDM symbol information") regarding the starting position of a symbol sequence composed of multiple OFDM symbols (symbols), and the length of each OFDM symbol. Additionally, the RRH and the BBU adjust the lengths of the OFDM symbols by separating a portion of the symbol sequence based on the acquired OFDM symbol information, so as to equalize the lengths of all of the OFDM symbols that are to be compressed.

Herebelow, a detailed explanation will be given, using multiple embodiments (first embodiment and second embodiment) as examples.

First Embodiment

In the first embodiment, the RRH and the BBU acquire OFDM symbol information, and adjust the lengths of the OFDM symbols by separating a portion of the symbol sequence based on the acquired OFDM symbol information, so as to equalize the lengths of all of the OFDM symbols that are to be compressed. Additionally, the RRH and the BBU multiplex OFDM symbols, which have been compressed, with a portion of the separated symbol sequence, and transmit the result thereof.

Figure 1:
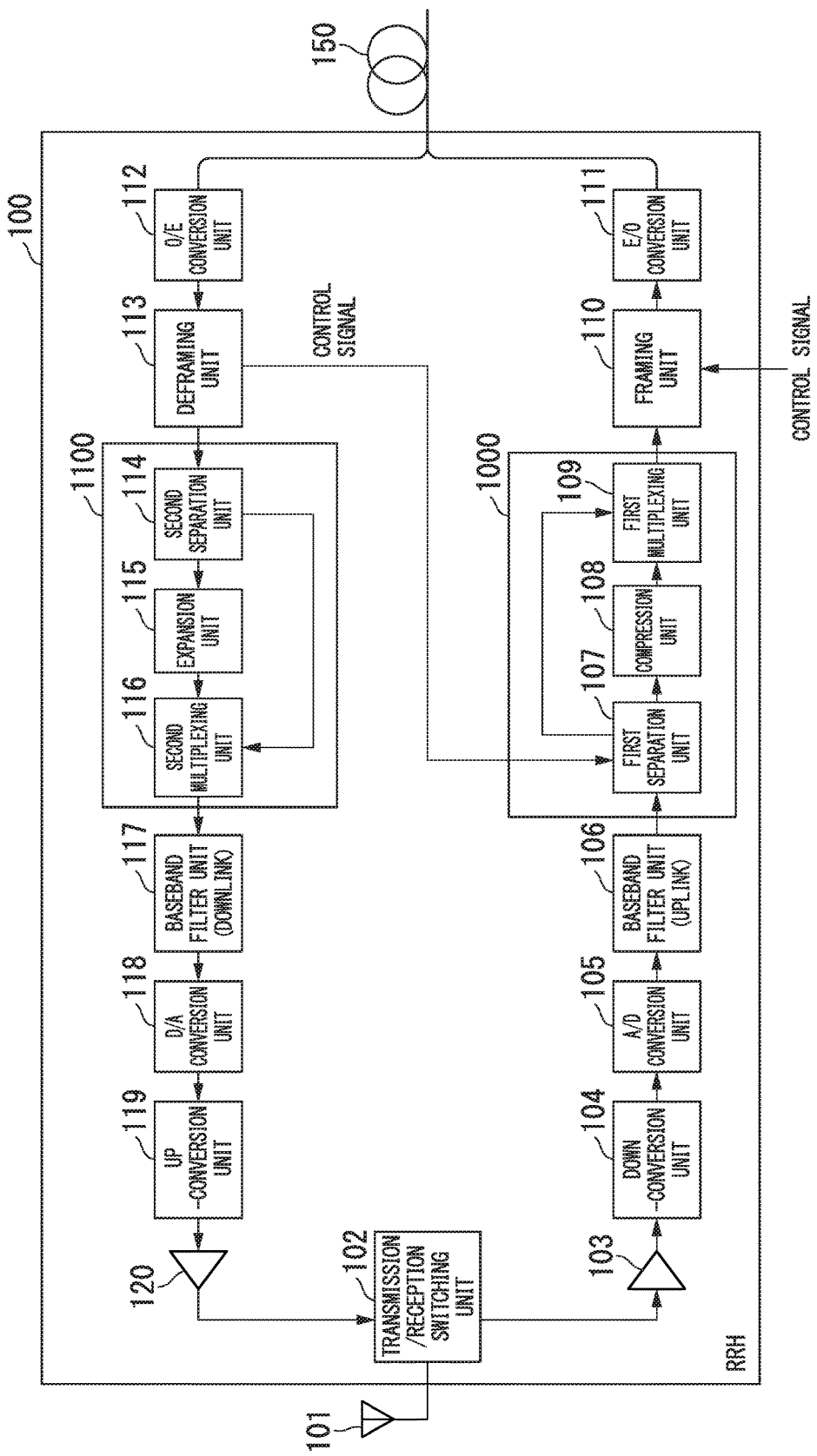
FIG. 1 is a schematic block diagram illustrating the functional structure of an RRH 100 in a first embodiment.
Figure 2:
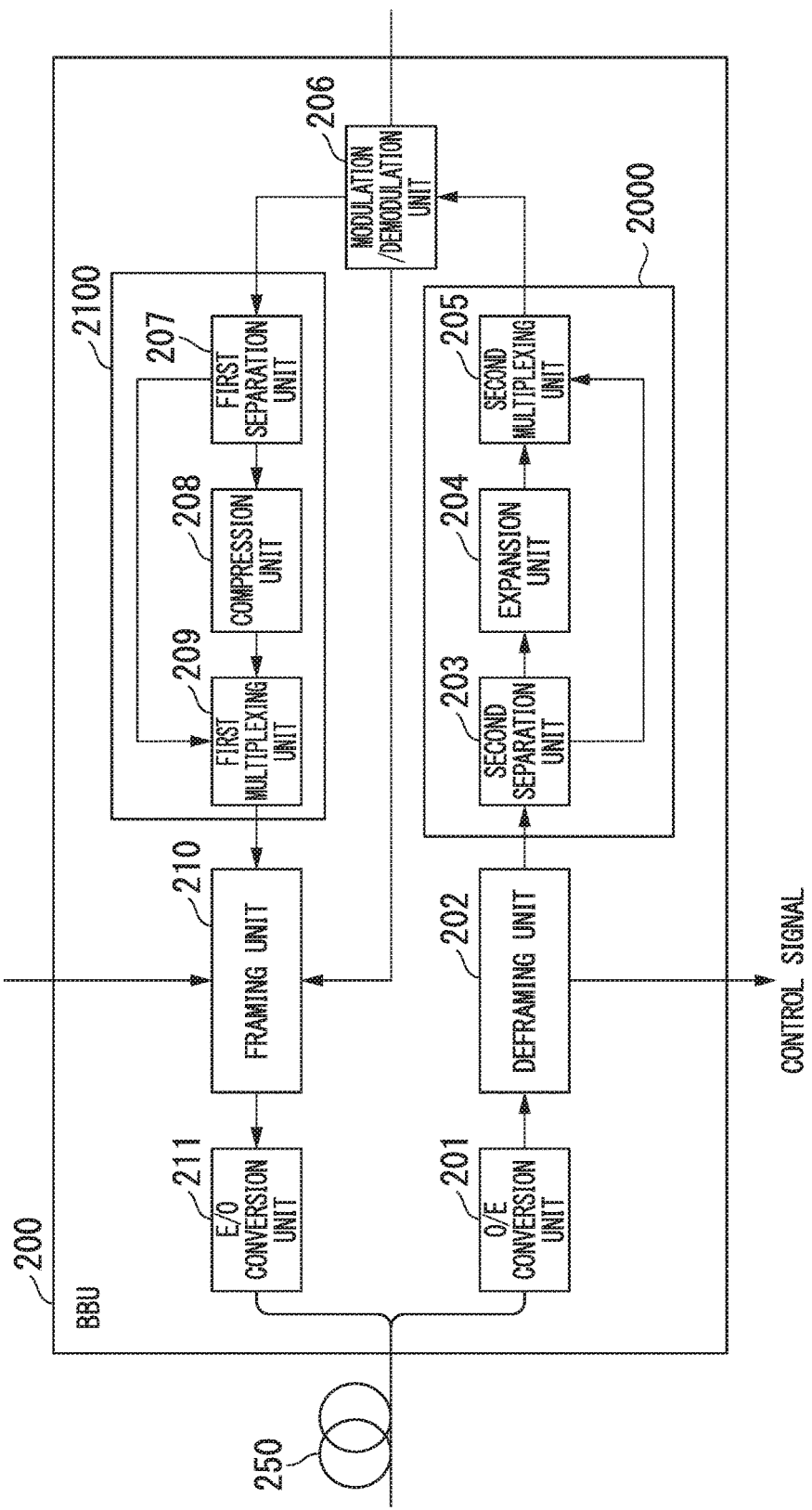
FIG. 2 is a schematic block diagram illustrating the functional structure of a BBU 200 in the first embodiment.

FIG. 1 is a schematic block diagram illustrating the functional structure of the RRH 100 in the first embodiment. Additionally, FIG. 2 is a schematic diagram illustrating the functional structure of the BBU 200 in the first embodiment. First, the RRH 100 will be explained.

The RRH 100 includes an antenna 101, a transmission/reception switching unit 102, an amplifier 103, a down-conversion unit 104, an A/D conversion unit 105, a baseband filter unit 106, a compression processing unit 1000, a framing unit 110, an E/O conversion unit 111, an O/E conversion unit 112, a deframing unit 113, an expansion processing unit 1100, a baseband filter unit 117, a D/A conversion unit 118, an up-conversion unit 119, and an amplifier 120. The compression processing unit 1000 includes a first separation unit 107, a compression unit 108, and a first multiplexing unit 109. The expansion processing unit 1100 includes a second separation unit 114, an expansion unit 115, and a second multiplexing unit 116.

The antenna 101 transmits and receives wireless signals with respect to a wireless terminal connected to the RRH 100. The transmission/reception switching unit 102 switches the antenna 101 between transmission and reception. It is to be noted that the transmission/reception switching unit 102 is compatible with both FDD (Frequency Division Duplex) and TDD (Time Division Duplex). For example, when the BBU 200 and RRH 100 are connected by a CPRI interface, around 1/16 of the total capacity is used for sending control signals while 15/16 is used for sending IQ data, and as a control signal, a K28.5 code or the like is transmitted in order to establish a CPRI link. The amplifier 103 amplifies the signal power of a received wireless signal to a level that allows for signal processing. The down-conversion unit 104 down-converts the wireless signal into the baseband. The A/D conversion unit 105 converts the down-converted wireless signal (analog signal) into IQ data, which is a digital signal. The baseband filter unit 106 performs a filtering process on the IQ data. Due to this process, a symbol sequence is generated from the wireless signal.

The first separation unit 107 separates a portion of the symbol sequence based on OFDM symbol information acquired from the BBU 200. In the following explanation, the separated portion of the symbol sequence will be referred to as a separated symbol.

The compression unit 108 compresses all of the OFDM symbols to be compressed that are left after removing the separated symbol (hereinafter referred to as the "remaining OFDM symbols"), by frames having a preset frame size.

The first multiplexing unit 109 generates a multiplexed signal by multiplexing the separated symbol with the compressed remaining OFDM symbols.

Since the length of the separated symbol is much shorter than the length of the remaining OFDM symbols, more efficient transmission is possible by transmitting the separated symbol and the compressed remaining OFDM symbols in multiplexed form.

The framing unit 110 generates a frame signal by multiplexing the multiplexed signal with a control signal.

The E/O conversion unit 111 converts the frame signal into an optical signal and transmits the converted optical signal to the BBU 200 via an optical fiber 150.

The O/E conversion unit 112 converts an optical signal received via the optical fiber 150 into a frame signal (electrical signal).

The deframing unit 113 extracts a control signal and a multiplexed signal from a frame signal.

The second separation unit 114 separates a portion of the multiplexed signal based on OFDM symbol information acquired from the BBU 200.

The expansion unit 115 expands the signal from which the separated portion of the multiplexed signal has been removed (compressed remaining OFDM symbols). Specifically, the expansion unit 115 restores the remaining OFDM symbols by decompressing the compressed remaining OFDM symbols.

The second multiplexing unit 116 generates a multiplexed signal by multiplexing the separated portion of the multiplexed signal (separated symbol) with the restored remaining OFDM symbols.

The baseband filter unit 117 performs a filtering process on the multiplexed signal.

The D/A conversion unit 118 converts the filtered multiplexed signal into an analog signal.

The up-conversion unit 119 up-converts the analog signal.

The amplifier 120 amplifies the power of the analog signal to a predetermined transmission power.

Next, the BBU 200 will be explained.

The BBU 200 includes an O/E conversion unit 201, a deframing unit 202, an expansion processing unit 2000, a modulation/demodulation unit 206, a compression processing unit 2100, a framing unit 210, and an E/O conversion unit 211. The expansion processing unit 2000 includes a second separation unit 203, an expansion unit 204, and a second multiplexing unit 205. The compression processing unit 2100 includes a first separation unit 207, a compression unit 208, and a first multiplexing unit 209.

The O/E conversion unit 201 converts an optical signal received via an optical fiber 250 into a frame signal (electrical signal). The deframing unit 202 extracts a control signal and a multiplexed signal from the frame signal.

The second separation unit 203 separates a portion of the multiplexed signal based on OFDM symbol information.

The expansion unit 204 restores remaining OFDM symbols by decompressing the signal from which the separated portion of the multiplexed signal has been removed (compressed remaining OFDM symbols).

The second multiplexing unit 205 generates a multiplexed signal by multiplexing the separated portion of the multiplexed signal (separated symbol) with the restored remaining OFDM symbols.

The modulation/demodulation unit 206 restores the wireless signal by demodulating the multiplexed signal. Additionally, the modulation/demodulation unit 206 outputs the OFDM symbols of the IQ data of the wireless signal to the first separation unit 207.

The first separation unit 207 separates a portion of the symbol sequence based on the acquired OFDM symbol information.

The compression unit 208 compresses the remaining OFDM symbols by frames having a preset frame size.

The first multiplexing unit 209 generates a multiplexed signal by multiplexing the separated symbol with the compressed remaining OFDM symbols.

The framing unit 210 generates a frame signal by multiplexing the multiplexed signal with a control signal. The E/O conversion unit 211 converts the frame signal into an optical signal and transmits the converted optical signal to the RRH 100 via the optical fiber 250.

The first separation unit 107 and the first separation unit 207 determine the locations at which the OFDM symbols are to be separated based on the acquired OFDM symbol information. As the method for the first separation unit 207 to acquire the OFDM symbol information, it could be acquired from the modulation/demodulation unit 206 of the BBU 200. In that case, the first separation unit 107 of the RRH 100 must be notified of the OFDM symbol information. Therefore, if the BBU 200 and RRH 100 are connected by a CPRI interface, then the OFDM symbol information can be transmitted by using reserved bits or the like in the CPRI control signal. The first separation unit 107 acquires the OFDM symbol information from the BBU 200 by being notified of the OFDM symbol information.

For example, in the case of a TDD LTE system, uplink and downlink communications are switched at a minimum period of 1 ms. Therefore, if the starting position of an OFDM symbol in a downlink 0.5 ms period and the OFDM symbol length information are known, then it is possible to estimate the starting position and OFDM symbol length information of an uplink OFDM symbol. Normally, the OFDM symbol lengths are fixed for each system, so the OFDM symbol length information could be pre-stored in the first separation unit 107 and the first separation unit 207. Additionally, in an LTE system, if the starting position of an OFDM symbol having a CP (cyclic prefix) length of 160 is known, then the starting positions and OFDM symbol lengths of subsequent OFDM symbols will also be known. For this reason, it is sufficient for the first separation unit 107 and the first separation unit 207 to acquire just the starting position information for an OFDM symbol having a CP length of 160. Additionally, since the OFDM signals are outputted continuously, it is sufficient to obtain the starting position of an OFDM symbol just once, and there is no need to periodically acquire starting position information.

Additionally, the second separation unit 114 and the second separation unit 203 may determine the locations that are to be separated by acquiring OFDM symbol information from the control signal, or the locations to be separated may be appended as header information at the first multiplexing unit 109 and the first multiplexing unit 209, and the locations to be separated may be determined by acquiring OFDM symbol information by referring to the header information.

It is to be noted that in the following explanation, the first separation unit 107 and the first separation unit 207 will be referred to simply as first separation units when no particular distinction is to be made therebetween. Additionally, in the following explanation, the first multiplexing unit 109 and the first multiplexing unit 209 will be referred to simply as first multiplexing units when no particular distinction is to be made therebetween. Additionally, in the following explanation, the second separation unit 114 and the second separation unit 203 will be referred to simply as second separation units when no particular distinction is to be made therebetween. Additionally, in the following explanation, the second multiplexing unit 116 and the second multiplexing unit 205 will be referred to simply as second multiplexing units when no particular distinction is to be made therebetween. Additionally, in the following explanation, the compression unit 108 and the compression unit 208 will be referred to simply as compression units when no particular distinction is to be made therebetween. Additionally, in the following explanation, the expansion unit 115 and the expansion unit 204 will be referred to simply as expansion units when no particular distinction is to be made therebetween.

The multiplexing method for the first multiplexing unit could, for example, be time division multiplexing. When using MPEG-4 ALS, the functions of a first multiplexing unit can be achieved by compressing the remaining OFDM symbols, writing the separated symbol in the ALSSpecific-Config AUX region (extension region), and multiplexing them in the same bitstream.

Figure 3:
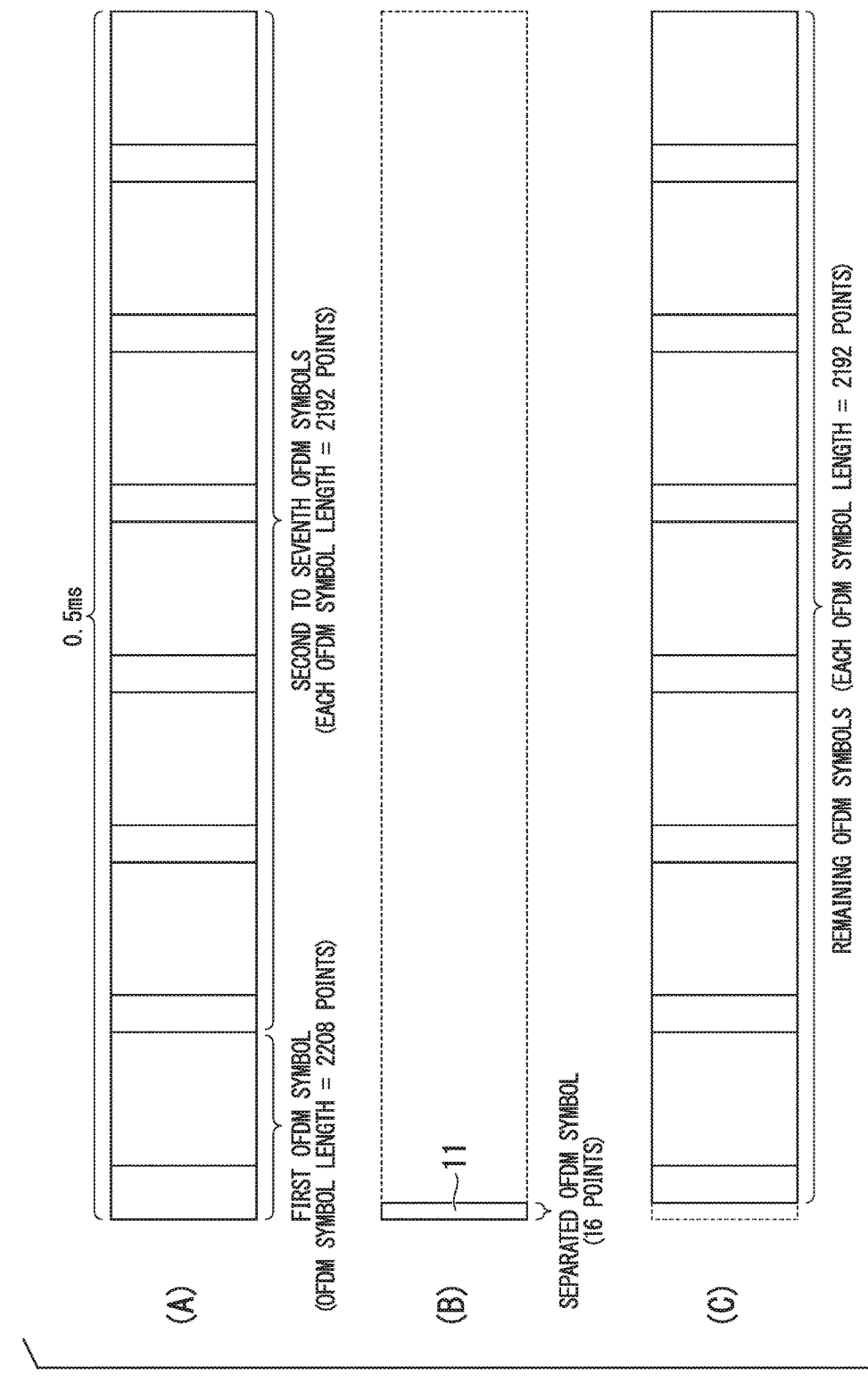
FIG. 3 is a diagram for explaining the operations in a first separation unit in the first embodiment.

FIG. 3 is a diagram for explaining the operations of the first separation unit in the first embodiment.

FIG. 3(A) is a diagram showing a specific example of a symbol sequence in an LTE system. As shown in FIG. 3(A), the symbol sequence is composed of multiple OFDM symbols. In an LTE system, the OFDM symbol lengths of the second to seventh OFDM symbols are the same, while the OFDM symbol length of the first OFDM symbol is 16 points longer. Such OFDM symbol length information for each OFDM symbol is included in the OFDM symbol information. Therefore, the first separation unit identifies the starting position of an OFDM symbol from OFDM symbol starting position information contained in the OFDM symbol information. Then, the first separation unit separates a portion of the symbol sequence at the specified OFDM symbol starting position. Specifically, the first separation unit separates a portion 11 of the cyclic prefix of the first OFDM symbol, as shown in FIG. 3(B). This portion 11 of the cyclic prefix of the first OFDM symbol is a separated symbol. For example, the first separation unit may separate 16 points which are a portion of the 160 points in the cyclic prefix. As a result of this process, the length of the first OFDM symbol becomes 2208−16=2192. In other words, as shown in FIG. 3(C), the lengths of the first to seventh OFDM symbols (remaining OFDM symbols) that are to be compressed are equalized. At this time, by setting the frame size to 2192/n (n being a natural number), it is possible to use a single frame size, and the compression processes performed by the compression unit will not be compression processes that include multiple OFDM symbols. The operations of the second separation unit are similar to the operations of the first separation unit.

Figure 4A:
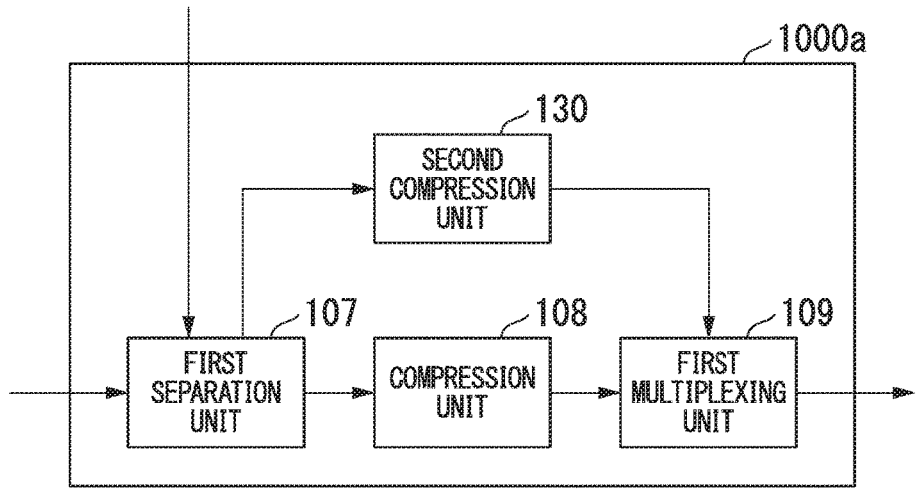
FIG. 4A is a schematic block diagram illustrating the structure of a compression processing unit when a second compression unit is provided in the RRH 100.
Figure 4B:
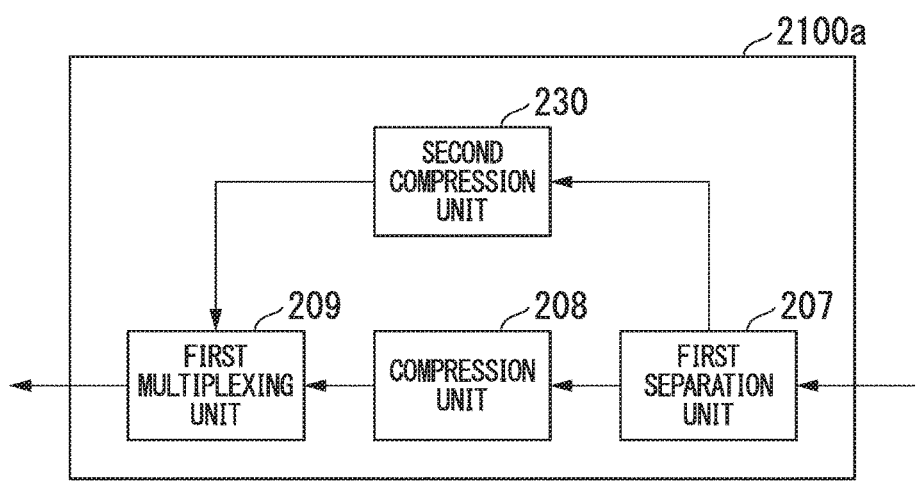
FIG. 4B is a schematic block diagram illustrating the structure of a compression processing unit when a second compression unit is provided in the BBU 200.
Figure 4C:
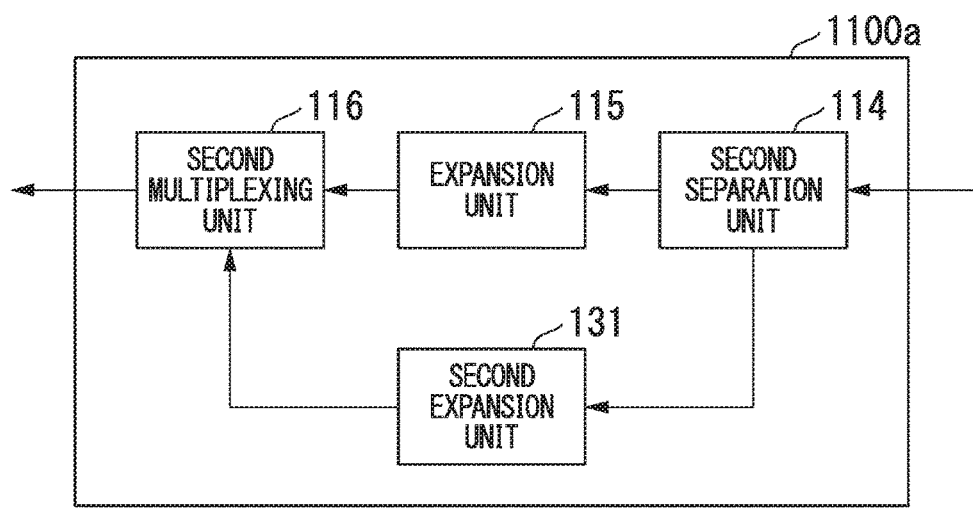
FIG. 4C is a schematic block diagram illustrating the structure of an expansion processing unit when a second expansion unit is provided in the RRH 100.
Figure 4D:
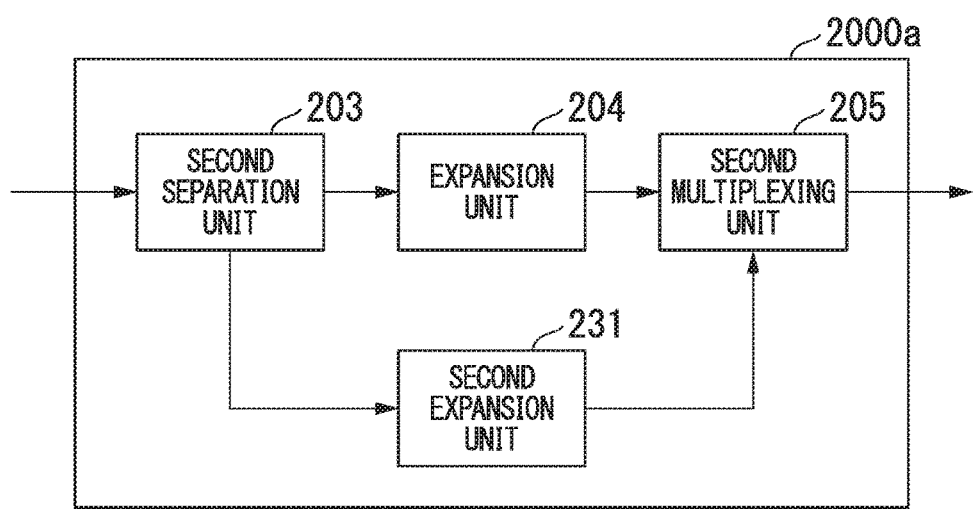
FIG. 4D is a schematic block diagram illustrating the structure of an expansion processing unit when a second expansion unit is provided in the BBU 200.

It is to be noted that the portion of the symbol sequence separated by the first separation unit may be directly inputted, without modification, to the first multiplexing unit. Alternatively, the RRH 100 and the BBU 200 may each include a second compression unit (local symbol sequence compression unit), and after the second compression unit performs a compression process on the separated symbol, the compressed separated symbol may be inputted to the first multiplexing unit. In other words, the RRH 100 may include a compression processing unit 1000a shown in FIG. 4A instead of the compression processing unit 1000, the compression processing unit 1000a including a second compression unit 130 in addition to the structure of the compression processing unit 1000. Additionally, the BBU 200 may include a compression processing unit 2100a shown in FIG. 4B instead of the compression processing unit 2100, the compression processing unit 2100a including a second compression unit 230 in addition to the structure of the compression processing unit 2100. In this case, the first multiplexing unit generates a multiplexed signal by multiplexing the compressed remaining OFDM symbols, which have been compressed by the compression unit, with the separated symbol compressed by the second compression unit. Additionally, if the RRH 100 and the BBU 200 include a second compression unit, then the RRH 100 and the BBU 200 must also include a second expansion unit (local symbol sequence expansion unit) that performs an expansion process on the separated symbol separated by the second separation unit. In other words, the RRH 100 includes an expansion processing unit 1100a shown in FIG. 4C instead of the expansion processing unit 1100, the expansion processing unit 1100a including a second expansion unit 131 in addition to the structure of the expansion processing unit 1100. Additionally, the BBU 200 includes an expansion processing unit 2000a shown in FIG. 4D instead of the expansion processing unit 2000, the expansion processing unit 2000a including a second expansion unit 231 in addition to the structure of the expansion processing unit 2000. In this case, the second multiplexing unit generates a multiplexed signal by multiplexing the remaining OFDM symbols restored by the expansion unit with the separated symbol restored by the second expansion unit.

Thus, the transmission efficiency can be raised by further compressing the separated symbol (portion of the symbol sequence).

Figure 5:
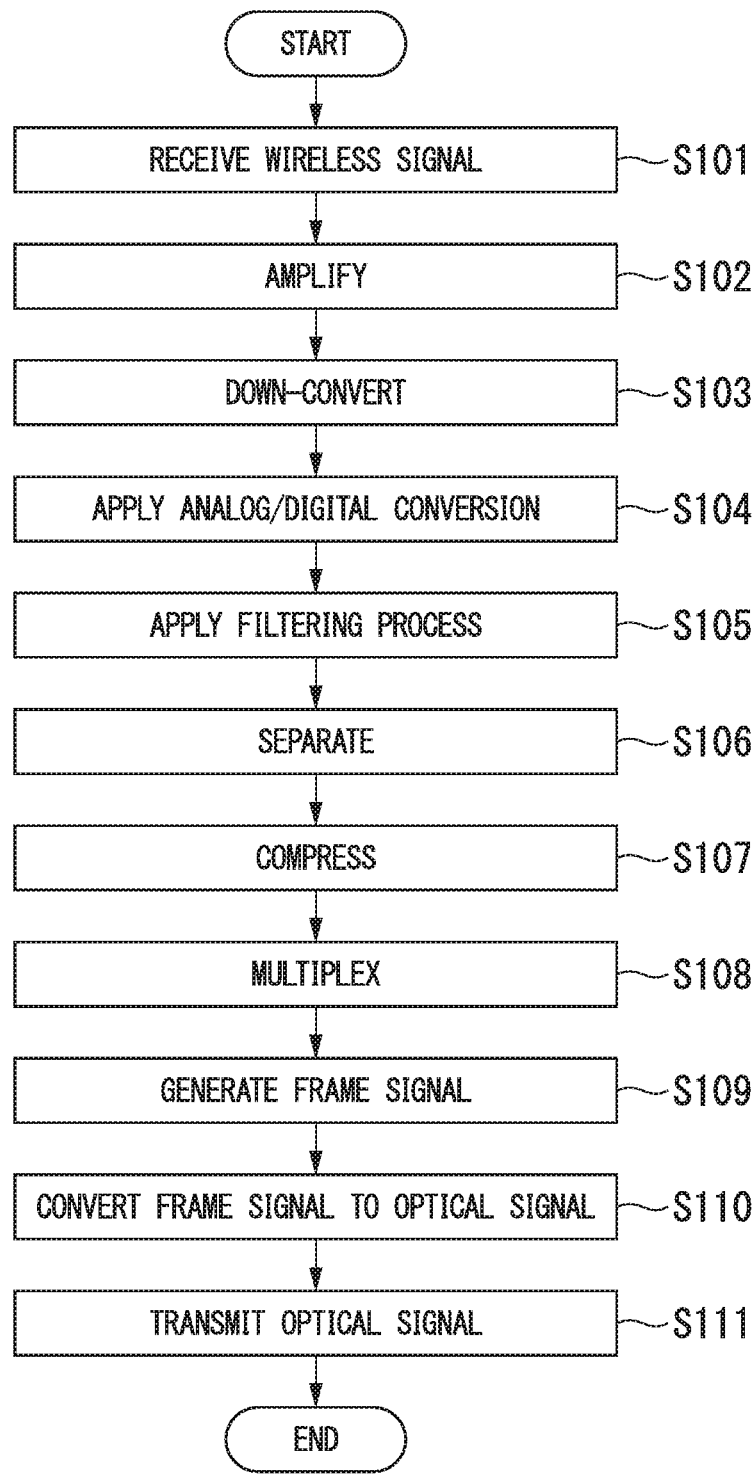
FIG. 5 is a flow chart showing the processing flow for an uplink in the RRH 100 in the first embodiment.

FIG. 5 is a flow chart showing the processing flow for an uplink in the RRH 100 in the first embodiment.

The antenna 101 receives a wireless signal transmitted from a wireless terminal connected to the RRH 100 (step S101). The antenna 101 outputs the received wireless signal to the amplifier 103 via a transmission/reception switching unit 102. The amplifier 103 amplifies the signal power of the wireless signal to a level allowing signal processing (step S102). The down-conversion unit 104 down-converts the wireless signal into the baseband (step S103). Thereafter, the A/D conversion unit 105 converts the down-converted wireless signal into. IQ data, which is a digital signal (step S104). The baseband filter unit 106 performs a filtering process on the IQ data (step S105).

The first separation unit 107 separates a portion of the symbol sequence based on OFDM symbol information acquired from the BBU 200 (step S106). Due to the processing in step S106, the OFDM symbols are separated between a separated symbol and remaining OFDM symbols. The first separation unit 107 outputs the separated symbol to the first multiplexing unit 109. Additionally, the first separation unit 107 outputs the remaining OFDM symbols to the compression unit 108. The compression unit 108 compresses the remaining OFDM symbols (step S107). The first multiplexing unit 109 generates a multiplexed signal by multiplexing the separated symbol with the compressed remaining OFDM symbols (step S108). The framing unit 110 generates a frame signal by multiplexing the multiplexed signal with a control signal (step S109). The E/O conversion unit 111 converts the frame signal into an optical signal (step S110). Then, the E/O conversion unit 111 transmits the optical signal to the BBU 200 via the optical fiber 150 (step S111).

Figure 6:
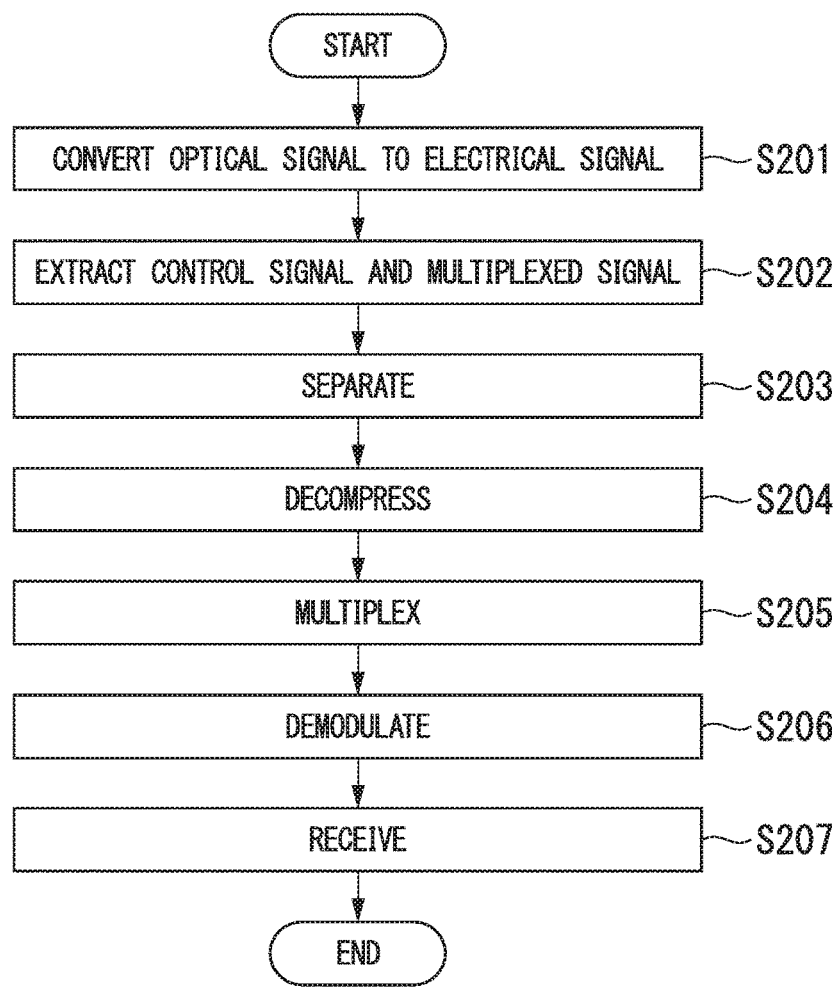
FIG. 6 is a flow chart showing the processing flow for an uplink in the BBU 200 in the first embodiment.

FIG. 6 is a flow chart showing the processing flow for an uplink in the BBU 200 in the first embodiment.

The O/E conversion unit 201 converts an optical signal received via the optical fiber 250 into a frame signal (electrical signal) (step S201). The O/E conversion unit 201 outputs the frame signal to the deframing unit 202. The deframing unit 202 extracts a control signal and a multiplexed signal from the frame signal (step S202). The second separation unit 203 separates a portion of the multiplexed signal based on the OFDM symbol information (step S203). Due to the processing in step S203, the OFDM symbols contained in the multiplexed signal are separated into a separated symbol and remaining OFDM symbols. The second separation unit 203 outputs the separated symbol to the second multiplexing unit 205. Additionally, the second separation unit 203 outputs the remaining OFDM symbols to the expansion unit 204.

The expansion unit 204 restores the remaining OFDM symbols by decompressing the compressed remaining OFDM symbols (step S204). The second multiplexing unit 205 generates a multiplexed signal by multiplexing the separated symbol with the restored remaining OFDM symbols (step S205). The modulation/demodulation unit 206 restores the wireless signal by demodulating the multiplexed signal (step S206). The modulation/demodulation unit 206 receives the restored wireless signal (step S207). It is to be noted that the reception in the processing in step S207 refers to the modulation/demodulation unit 206 acquiring a wireless signal which includes OFDM symbols to be demodulated.

Figure 7:
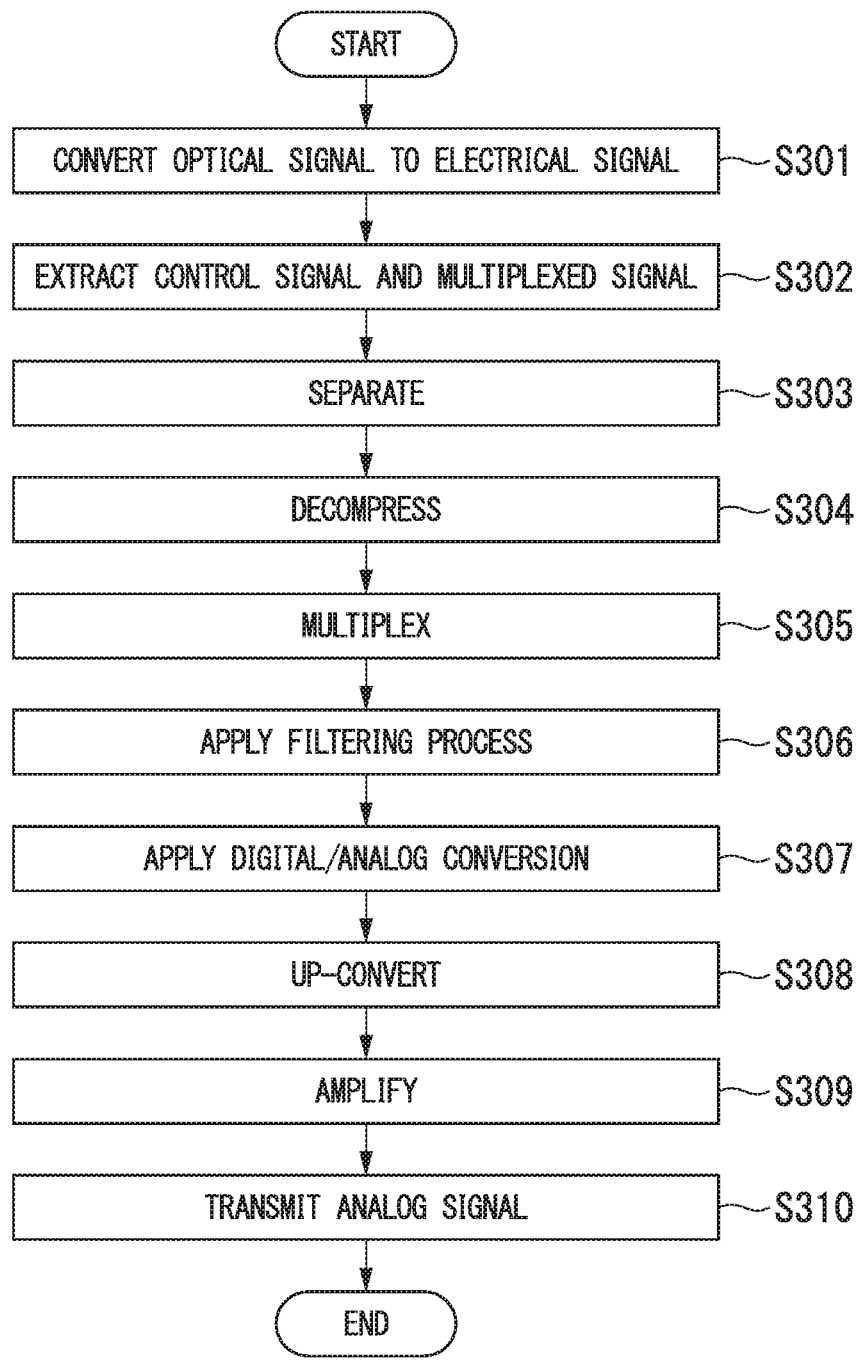
FIG. 7 is a flow chart showing the processing flow for a downlink in the RRH 100 in the first embodiment.

FIG. 7 is a flow chart showing the processing flow for a downlink in the RRH 100 in the first embodiment.

The O/E conversion unit 112 converts an optical signal received via the optical fiber 150 into a frame signal (electrical signal) (step S301). The deframing unit 113 extracts a control signal and a multiplexed signal from a frame signal (step S302). The second separation unit 114 separates a portion of the multiplexed signal based on the acquired OFDM symbol information (step S303). Due to the processing in step S303, the OFDM symbols are separated into a separated symbol and remaining OFDM symbols. The second separation unit 114 outputs the separated symbol to the second multiplexing unit 116. Additionally, the second multiplexing unit 114 outputs the remaining OFDM symbols to the expansion unit 115. The expansion unit 115 restores the remaining OFDM symbols by decompressing the compressed remaining OFDM symbols (step S304).

The second multiplexing unit 116 generates multiplexed signals by multiplexing the separated symbol with the restored remaining OFDM symbols (step S305). The baseband filter unit 117 performs a filtering process on the multiplexed signal (step S306). The D/A conversion unit 118 converts the filtered multiplexed signal into an analog signal (step S307). The up-conversion unit 119 up-converts the analog signal (step S308). The amplifier 120 amplifies the power of the analog signal to a predetermined transmission power (step S309). The antenna 101 transmits the analog signal to a wireless terminal connected to the RRH 100 (step S310).

Figure 8:
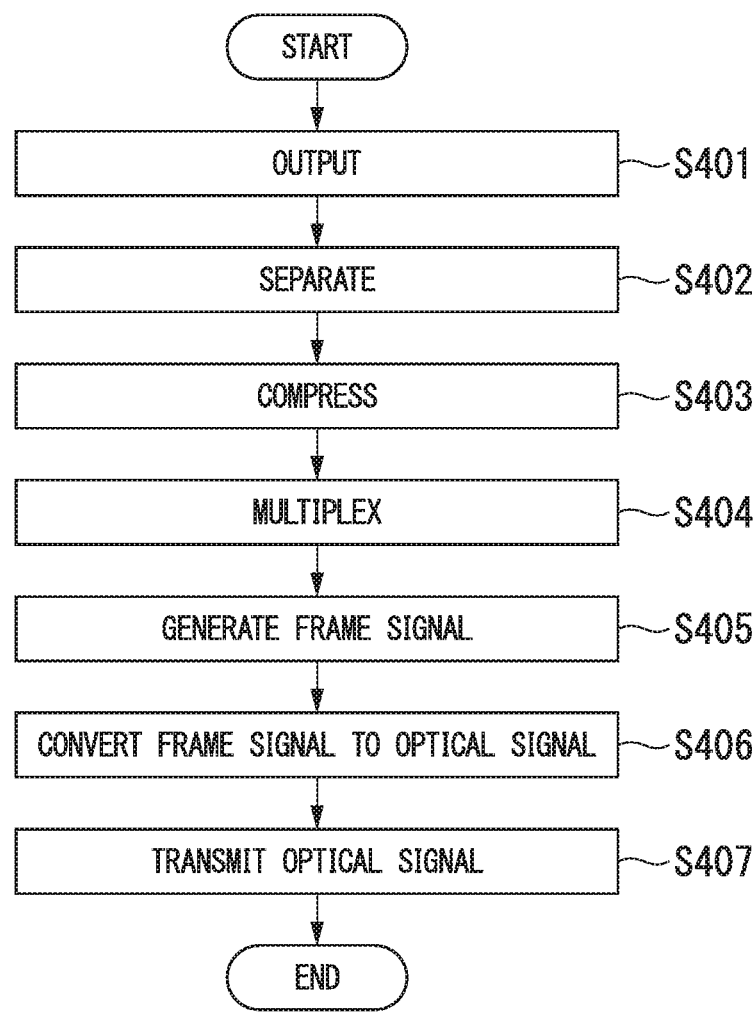
FIG. 8 is a flow chart showing the processing flow for a downlink in the BBU 200 in the first embodiment.

FIG. 8 is a flow chart showing the processing flow for a downlink in the BBU 200 in the first embodiment.

The modulation/demodulation unit 206 outputs OFDM symbols to the first separation unit 207 (step S401). The first separation unit 207 separates a portion of the symbol sequence based on the acquired OFDM symbol information (step S402). Due to the processing in step S402, the OFDM symbols are separated into a separated symbol and remaining OFDM symbols. The first separation unit 207 outputs the separated symbol to the first multiplexing unit 209. Additionally, the first separation unit 207 outputs the remaining OFDM symbols to the compression unit 208. The compression unit 208 compresses the remaining OFDM symbols (step S403).

The first multiplexing unit 209 generates a multiplexed signal by multiplexing the separated symbol with the compressed remaining OFDM symbols (step S404). The framing unit 210 generates a frame signal by multiplexing the multiplexed signal with the control signal (step S405). The E/O conversion unit 211 converts the frame signal into an optical signal (step S406). Then, the E/O conversion unit 211 transmits the optical signal to the RRH 100 via an optical fiber 250 (step S407).

According to the RRH 100 and the BBU 200 configured as above, it is possible to reduce the worsening of the compression rate. Herebelow, this effect will be explained in detail.

The RRH 100 and the BBU 200 separate a portion of the symbol sequence when compressing the wireless signal. For example, in the case of LTE, the length of the first OFDM symbol is longer than that of the second to seventh OFDM symbols, so the RRH 100 and the BBU 200 separate a portion of the first symbol sequence. Due to this process, the RRH 100 and the BBU 200 equalize the lengths of all of the OFDM symbols that are to be compressed. Additionally, the RRH 100 and the BBU 200 perform compression processes by frames having a preset frame size, and thereby perform compression processes on frames that do not include OFDM symbols having different frequency characteristics. For this reason, it is possible to reduce the worsening of the compression rate overall. Additionally, since the worsening of the compression rate is reduced, it is possible to make effective use of the transmission band.

Modification Example

Figure 9A:
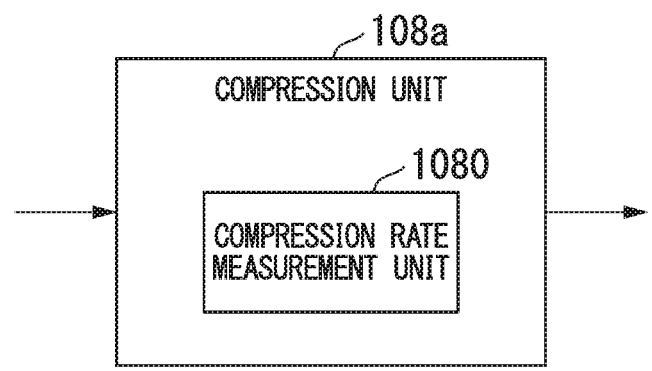
FIG. 9A is a schematic block diagram illustrating the structure of the compression unit when a compression rate measurement unit is provided in the RRH 100.
Figure 9B:
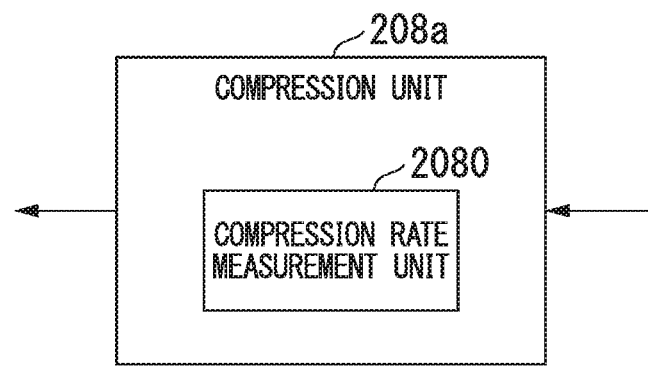
FIG. 9B is a schematic block diagram illustrating the structure of the compression unit when a compression rate measurement unit is provided in the BBU 200.

In the RRH 100, the compression unit 108 may be configured to further include a compression rate measurement unit that measures the compression rate of each frame in the frame-by-frame compression performed by the compression unit 108. Additionally, in the BBU 200, the compression unit 208 may be configured to further include a compression rate measurement unit that measures the compression rate of each frame in the frame-by-frame compression performed by the compression unit 208. In other words, the RRH 100 includes a compression unit 108a shown in FIG. 9A instead of the compression unit 108, the compression unit 108a including a compression rate measurement unit 1080 in addition to having the same functions as the compression unit 108. Additionally, the BBU 200 includes a compression unit 208a shown in FIG. 9B instead of the compression unit 208, the compression unit 208a including a compression rate measurement unit 2080 in addition to having the same functions as the compression unit 208.

When configured in this way, the RRH 100 and the BBU 200 may acquire the OFDM symbol starting position information based on the position at which the average value, the maximum value, or the like of the compression rate measured by the compression rate measurement unit is smallest. In other words, the RRH 100 and the BBU 200 acquire, as the OFDM symbol starting position information, the starting position of an OFDM symbol at which the compression rate properties are the best. In this case, the starting position of the OFDM symbol at which the compression rate properties are the best is the position at which the average value, the maximum value, or the like of the compression rate is smallest. When configured in this way, the first separation unit and the second separation unit must acquire the OFDM symbol length information by a method described above, or have the information pre-stored. Thereafter, the compression rate measurement unit may continue the compression rate measurements, and when the compression rate properties deteriorate, the above-described flow may be re-executed. The compression rate properties refer to the average compression rate, the maximum compression rate, or the like.

Due to the above-mentioned configuration, it is possible to correct the OFDM symbol starting position even if it has become displaced due to the wireless propagation environment, processing delays in the BBU/RRH, or delays in a fiber between the BBU 200 and the RRH 100. Additionally, the RRH 100 and the BBU 200 may acquire the OFDM symbol starting position for which the compression rate properties are the best, without requiring any additional information for determining the OFDM symbol starting position.

The compression rate measurement unit may reduce the amount of computation by using the results of analyses performed by the compression unit instead of measuring the compression rate. Specifically, the compression rate measurement unit estimates the information amount, i.e., the compression rate, in each frame, by using auto-correlation coefficients and PARCOR (Partial Auto-Correlation) coefficients obtained during linear predictive analysis. Due to this process, it is possible to reduce the processing amount needed for entropy coding.

Figure 10A:
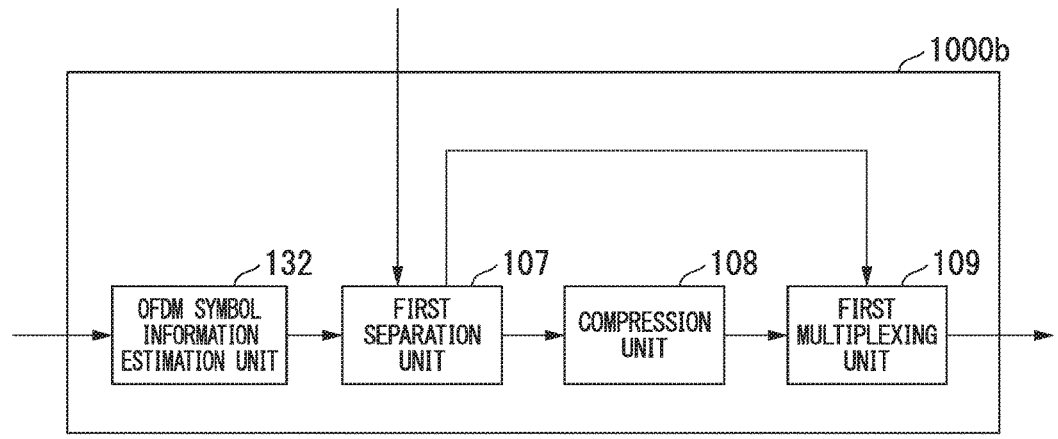
FIG. 10A is a schematic block diagram illustrating the structure of the compression processing unit when an OFDM symbol information estimation unit is provided in the RRH 100.
Figure 10B:
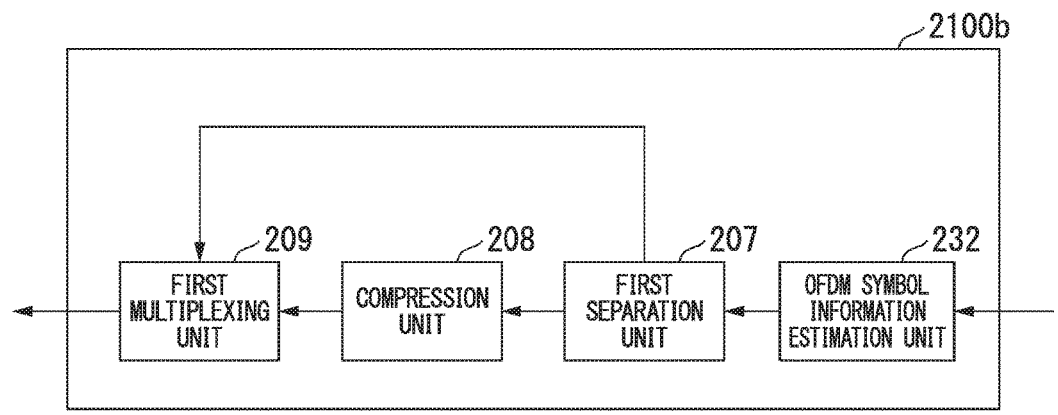
FIG. 10B is a schematic block diagram illustrating the structure of the compression processing unit when an OFDM symbol information estimation unit is provided in the BBU 200.

The RRH 100 and the BBU 200 may be configured so as to include an OFDM symbol information estimation unit that estimates an OFDM symbol starting position and OFDM symbol length information based on IQ data on a downlink or an uplink. In other words, the RRH 100 includes a compression processing unit 1000b shown in FIG. 10A instead of the compression processing unit 1000, the compression processing unit 1000b including an OFDM symbol information estimation unit 132 in addition to the structure of the compression processing unit 1000. Additionally, the BBU 200 includes a compression processing unit 2100b shown in FIG. 10B instead of the compression processing unit 2100, the compression processing unit 2100b including an OFDM symbol information estimation unit 232 in addition to the structure of the compression processing unit 2100. As a method for estimating the OFDM symbol starting position and OFDM symbol length information, there is a method of converting the IQ data by FFT and measuring the EVM (Error Vector Magnitude). In this case, the OFDM symbol information estimation unit may estimate the OFDM symbol starting position and the cyclic prefix length (OFDM symbol length) information by shifting the FFT window one point at a time, and using the positions and periods at which the EVM is smallest after the FFT. Alternatively, the OFDM symbol information estimation unit may make use of the periodicity of the cyclic prefixes to estimate the OFDM symbol starting position and the cyclic prefix length (OFDM symbol length) based on an auto-correlation of the downlink signal or the uplink signal. Due to this configuration, the RRH 100 and the BBU 200 can estimate the OFDM symbol starting position and the OFDM symbol length information from a downlink signal and an uplink signal respectively, without requiring any additional information for estimating the OFDM symbol starting position and the OFDM symbol length information.

Second Embodiment

In the second embodiment, the RRH and the BBU acquire OFDM symbol information, and adjust the lengths of the OFDM symbols so that the lengths of all of the OFDM symbols that are to be compressed are equalized by separating a portion of the symbol sequence based on the acquired OFDM symbol information. Additionally, on the transmission sides of the RRH and the BBU, the separated portion of the symbol sequence is discarded. On the reception sides of the RRH and the BBU, the discarded portion of the symbol sequence is restored.

Figure 11:
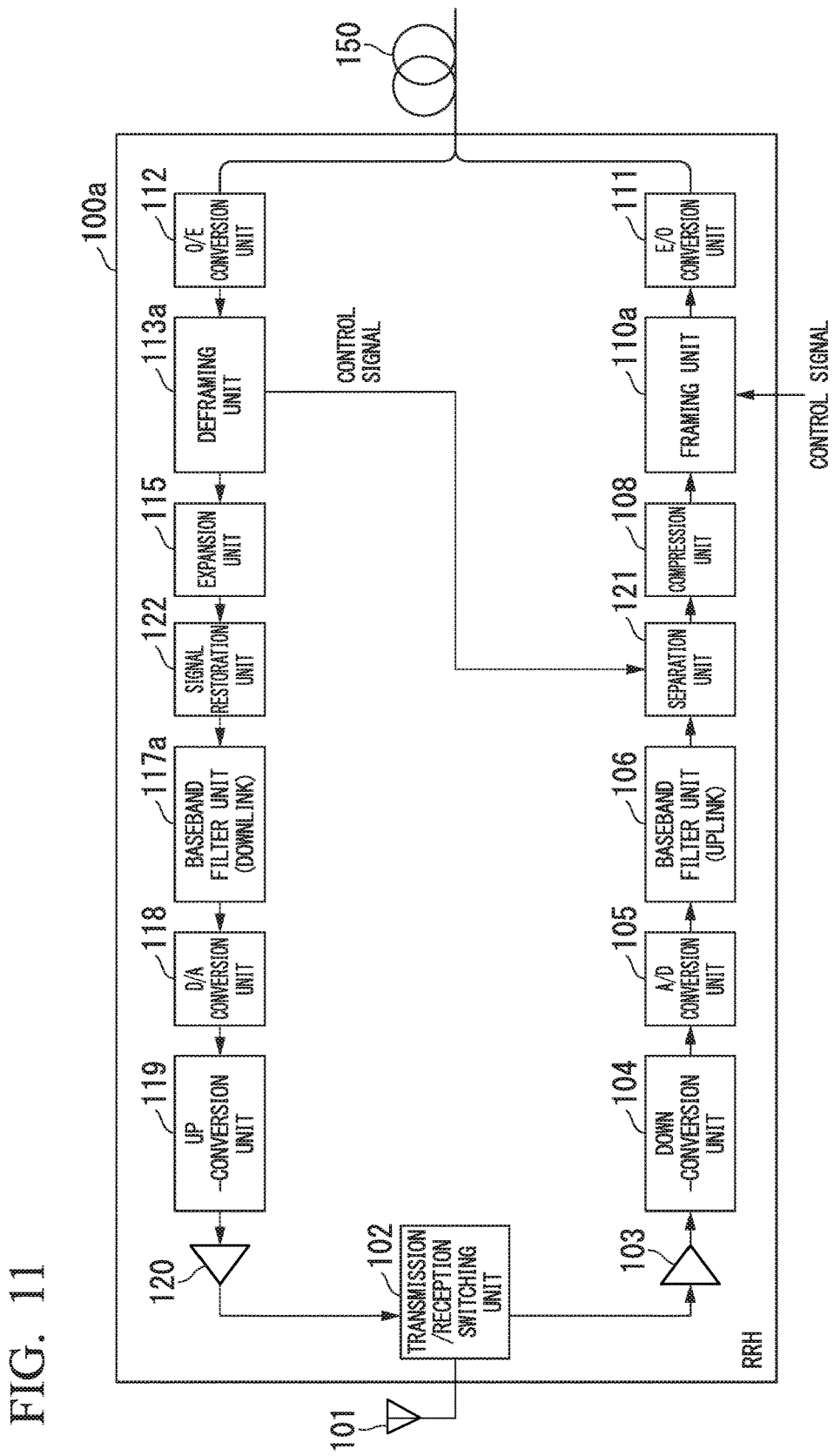
FIG. 11 is a schematic block diagram illustrating the functional structure of an RRH 100a in a second embodiment.
Figure 12:
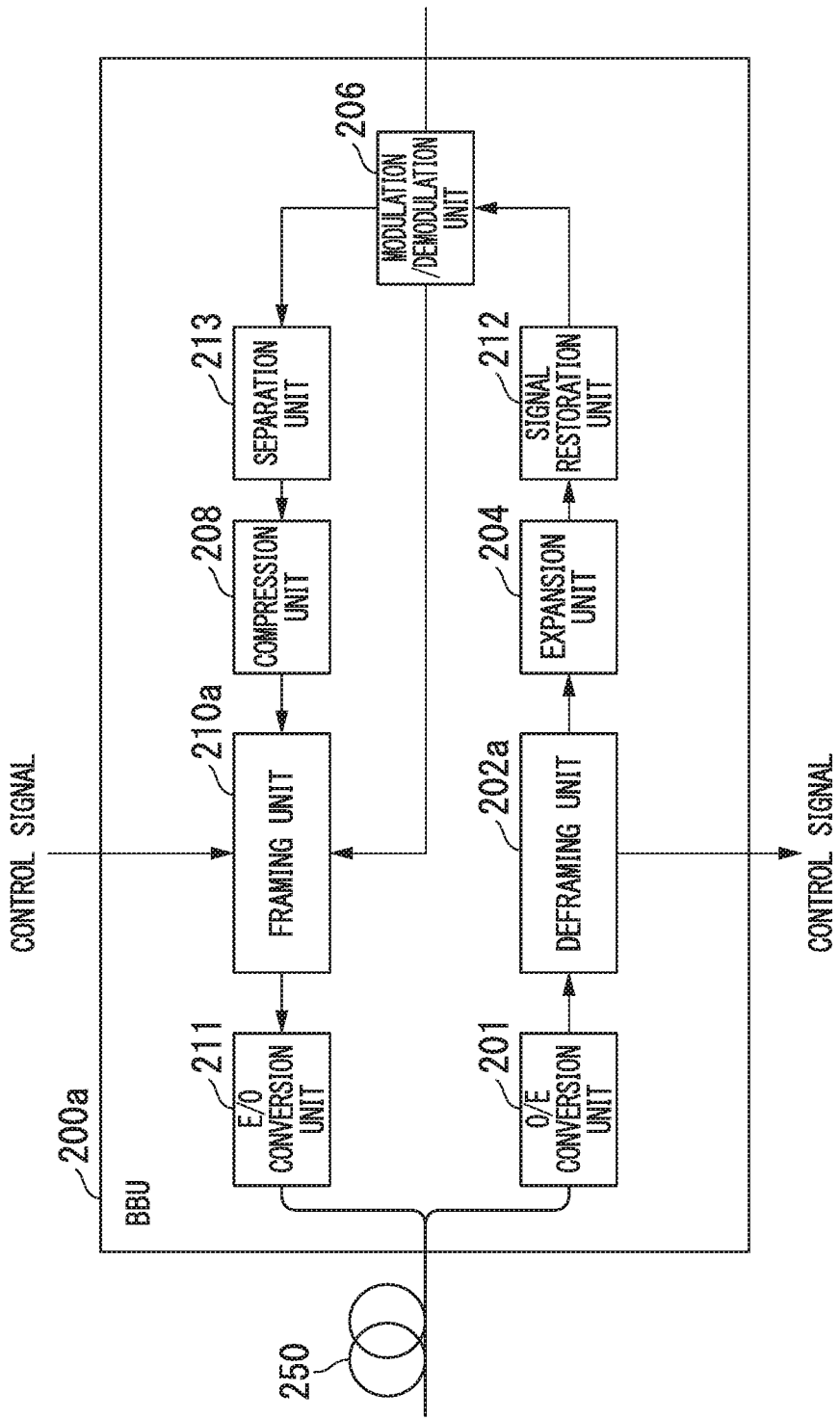
FIG. 12 is a schematic block diagram illustrating the functional structure of a BBU 200a in the second embodiment.

FIG. 11 is a schematic block diagram illustrating the functional structure of the RRH 100a in the second embodiment. Additionally, FIG. 12 is a schematic block diagram illustrating the functional structure of the BBU 200a in the second embodiment. First, the RRH 100a will be explained.

The RRH 100a includes an antenna 101, a transmission/reception switching unit 102, an amplifier 103, a down-conversion unit 104, an A/D conversion unit 105, a baseband filter unit 106, a compression unit 108, a framing unit 110a, an E/O conversion unit 111, an O/E conversion unit 112, a deframing unit 113a, an expansion unit 115, a baseband filter unit 117a, a D/A conversion unit 118, an up-conversion unit 119, an amplifier 120, a separation unit 121, and a signal restoration unit 122.

The RRH 100a has a different structure from the RRH 100 in that a framing unit 110a, a deframing unit 113a, a baseband filter unit 117a, a separation unit 121, and a signal restoration unit 122 are provided instead of the first separation unit 107, the first multiplexing unit 109, the framing unit 110, the deframing unit 113, the second separation unit 114, the second multiplexing unit 116, and the baseband filter unit 117. The other features of the RRH 100a are the same as those in the RRH 100. For this reason, the explanation of the RRH 100a as a whole will be omitted, and only the framing unit 110a, the deframing unit 113a, the baseband filter unit 1117a, the separation unit 121, and the signal restoration unit 122 will be explained.

The separation unit 121 performs processes similar to the first separation unit 107. In other words, the separation unit 121 separates a portion of the symbol sequence based on OFDM symbol information acquired from the BBU 200a. Additionally, the separation unit 121 discards the separated portion of the symbol sequence.

The framing unit 110a generates a frame signal by multiplexing the remaining OFDM symbols compressed by the compression unit 108 with a control signal.

The deframing unit 113a extracts the control signal and the compressed remaining OFDM symbols from the frame signal.

The signal restoration unit 122 restores the portion of the symbol sequence (separated symbol) discarded by the BBU 200a based on the remaining OFDM symbols.

The baseband filter unit 117a performs a filtering process on the restored separated symbol and the remaining OFDM symbols.

Next, the BBU 200*a* will be explained.

The BBU 200*a* includes an O/E conversion unit 201, a deframing unit 202*a*, an expansion unit 204, a modulation/demodulation unit 206, a compression unit 208, a framing unit 210*a*, an E/O conversion unit 211, a signal restoration unit 212, and a separation unit 213.

The BBU 200*a* has a different structure from the BBU 200 in that a deframing unit 202*a*, a framing unit 210*a*, a signal restoration unit 212, and a separation unit 213 are provided instead of the deframing unit 202, the second separation unit 203, the second multiplexing unit 205, the first separation unit 207, the first multiplexing unit 209, and the framing unit 210. The other features of the BBU 200*a* are the same as those in the BBU 200. For this reason, the explanation of the BBU 200*a* as a whole will be omitted, and only the deframing unit 202*a*, the framing unit 210*a*, the signal restoration unit 212 and, the separation unit 213 will be explained.

The deframing unit 202*a* extracts the control signal and the compressed remaining OFDM symbols from the frame signal.

The signal restoration unit 212 restores the portion of the symbol sequence (separated symbol) discarded by the RRF 100*a* based on the remaining OFDM symbols.

The separation unit 213 separates a portion of the symbol sequence based on the acquired OFDM symbol information. Additionally, the separation unit 213 discards the separated portion of the symbol sequence.

The framing unit 210*a* generates a frame signal by multiplexing the remaining OFDM symbols compressed by the compression unit 208 with a control signal.

The cyclic prefix is a copy of the latter half of the signal after IFFT output. Therefore, in the case of a downlink, even if the latter half of the signal after IFFT output is discarded by the separation unit 213 of the BBU 200*a*, the original signal can be restored by copying the cyclic prefix to the position of the discarded part of the signal in the signal restoration unit 122 of the RRH 100*a*. Alternatively, even if the cyclic prefix is discarded at the separation unit 213, the original signal can be restored by copying the latter half of the signal after IFFT output to the position of the discarded cyclic prefix in the signal restoration unit 122.

In the case of an uplink, the cyclic prefix of an OFDM symbol is discarded in the modulation/demodulation unit 206. For this reason, even if the cyclic prefix is discarded at the separation unit 121 of the RRH 100*a*, the length of the signal inputted to the modulation/demodulation unit 206 can be restored to the original state by adding other data in the signal restoration unit 212 of the BBU 200*a*. However, signals that are not in the format of OFDM symbols, such as random access signals, which are present in the system bandwidth, will have slightly inferior signal quality in the second embodiment.

As described above, the lengths of the OFDM symbols inputted to the compression unit and the expansion unit can be equalized by the separation unit 121 and the separation unit 213 separating and discarding a predetermined section (e.g., 16 points) of the cyclic prefix from the first OFDM symbol. Additionally, the lengths of the OFDM symbols inputted to the compression unit and the expansion unit can be equalized by the separation unit 121 and the separation unit 213 separating and discarding 160 points of the cyclic prefix from the first OFDM symbol, and separating and discarding 144 points of the cyclic prefix from the second to seventh OFDM symbols.

Figure 13:
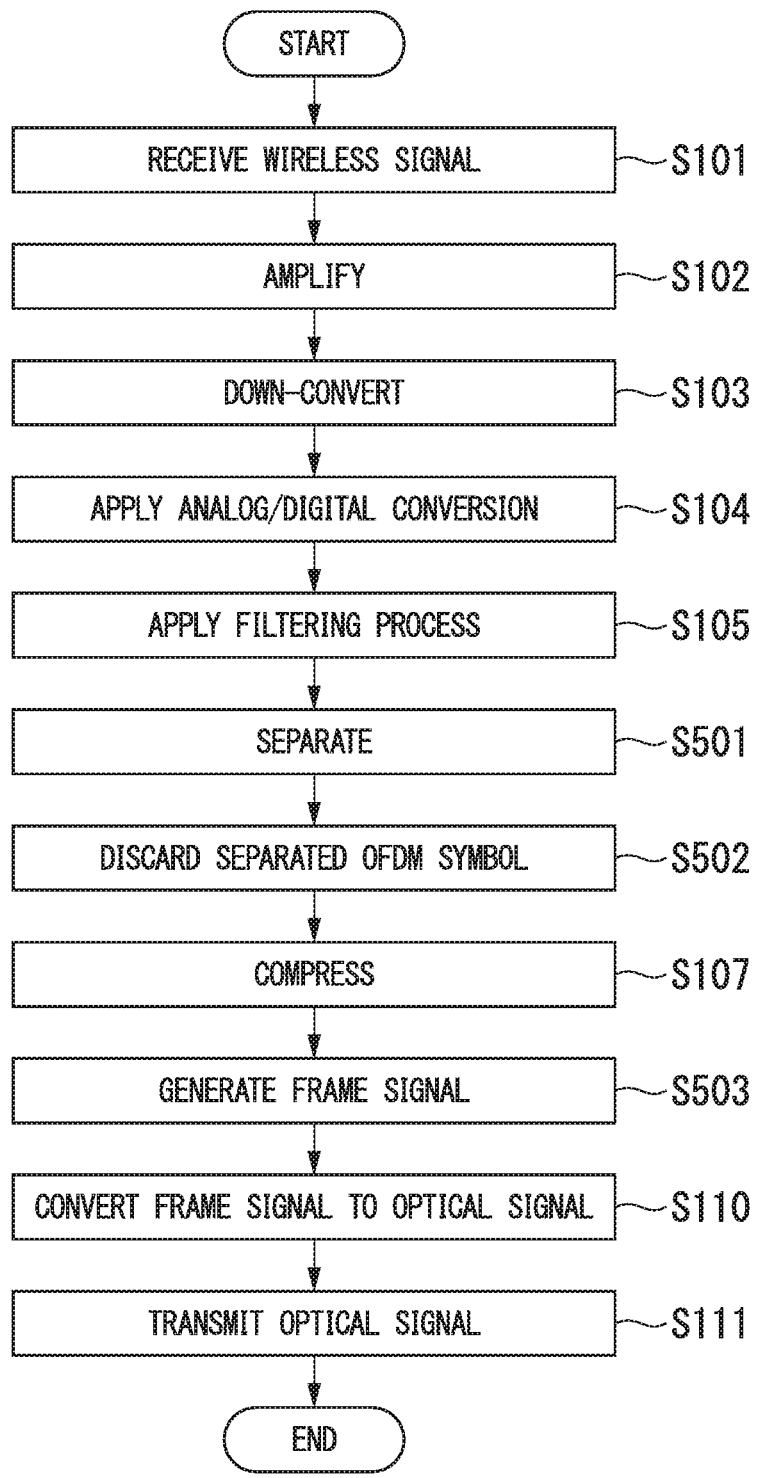
FIG. 13 is a flow chart showing the processing flow for an uplink in the RRH 100a in the second embodiment.

FIG. 13 is a flow chart of the processing flow for an uplink in the RRH 100*a* in the second embodiment. It is to be noted in FIG. 13, the processes that are the same as those in FIG. 5 are indicated by the same reference symbols as in FIG. 5, and their explanations will be omitted.

The separation unit 121 separates a portion of the symbol sequence based on the acquired OFDM symbol information (step S501). Thereafter, the separation unit 121 discards a portion of the separated symbol sequence (separated symbol) (step S502). The framing unit 110*a* generates a frame signal by multiplexing the remaining OFDM symbols compressed by the compression unit 108 with a control signal (step S503).

Figure 14:
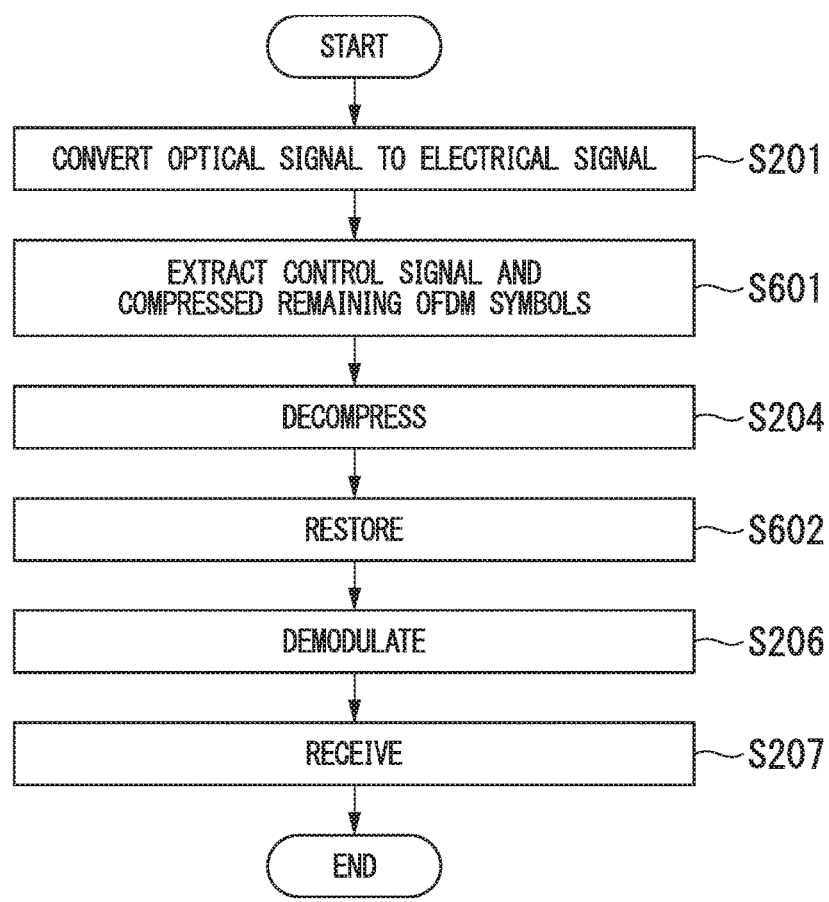
FIG. 14 is a flow chart showing the processing flow for an uplink in the BBU 200a in the second embodiment.

FIG. 14 is a flow chart showing the processing flow for an uplink in the BBU 200*a* in the second embodiment. It is to be noted in FIG. 14, the processes that are the same as those in FIG. 6 are indicated by the same reference symbols as in FIG. 6, and their explanations will be omitted.

The deframing unit 202*a* extracts the control signal and the compressed remaining OFDM symbols from the frame signal (step S601). The signal restoration unit 212 restores the portion of the symbol sequence (separated symbol) discarded in the RRH 100*a* based on the remaining OFDM symbols (step S602).

Figure 15:
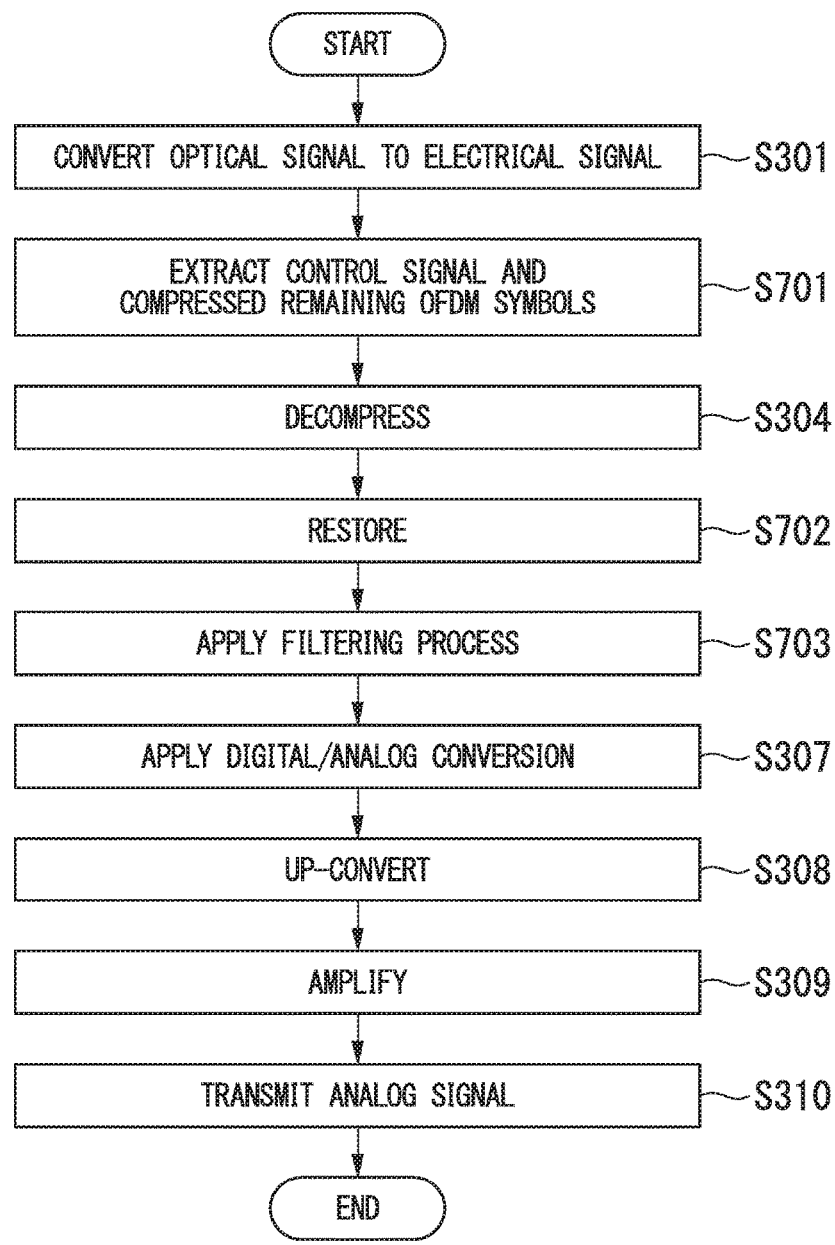
FIG. 15 is a flow chart showing the processing flow for a downlink in the RRH 100a in the second embodiment.

FIG. 15 is a flow chart of the processing flow for a downlink in the RRH 100*a* in the second embodiment. It is to be noted in FIG. 15, the processes that are the same as those in FIG. 7 are indicated by the same reference symbols as in FIG. 7, and their explanations will be omitted.

The deframing unit 113*a* extracts the control signal and the compressed remaining OFDM symbols from the frame signal (step S701). The signal restoration unit 122 restores the portion of the symbol sequence (separated symbol) discarded in the BBU 200*a* based on the remaining OFDM symbols (step S702). The baseband filter unit 117*a* performs a filtering process on the restored separated symbol and the remaining OFDM symbols (step S703).

Figure 16:
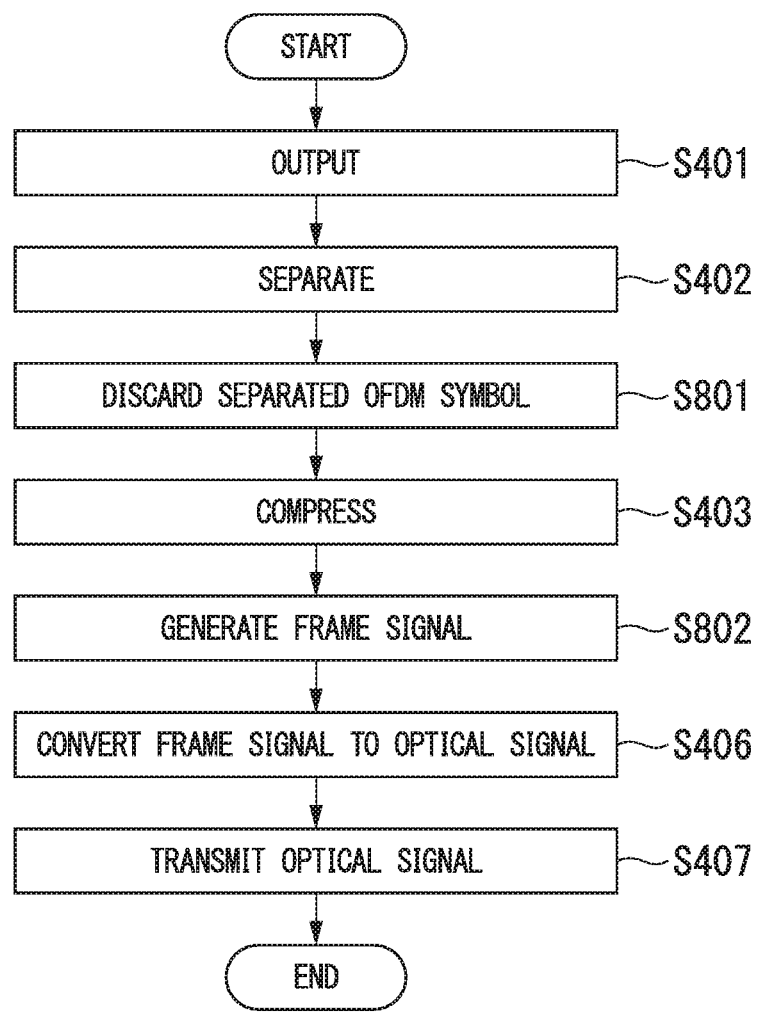
FIG. 16 is a flow chart showing the processing flow for a downlink in the BBU 200a in the second embodiment.
Figure 17:
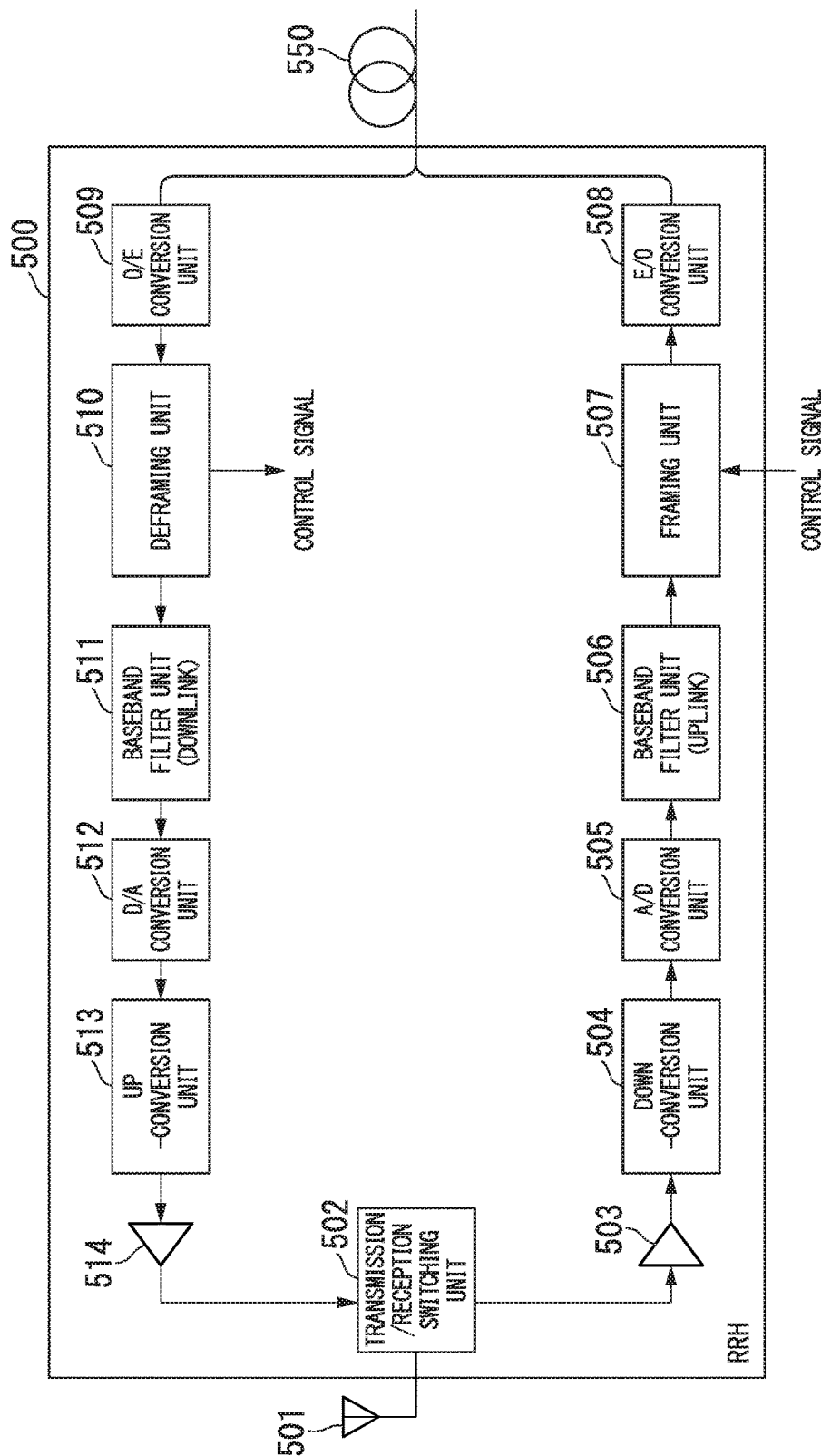
FIG. 17 is a schematic block diagram illustrating the functional structure of an RRH 500 during digital RoF transmission.
Figure 18:
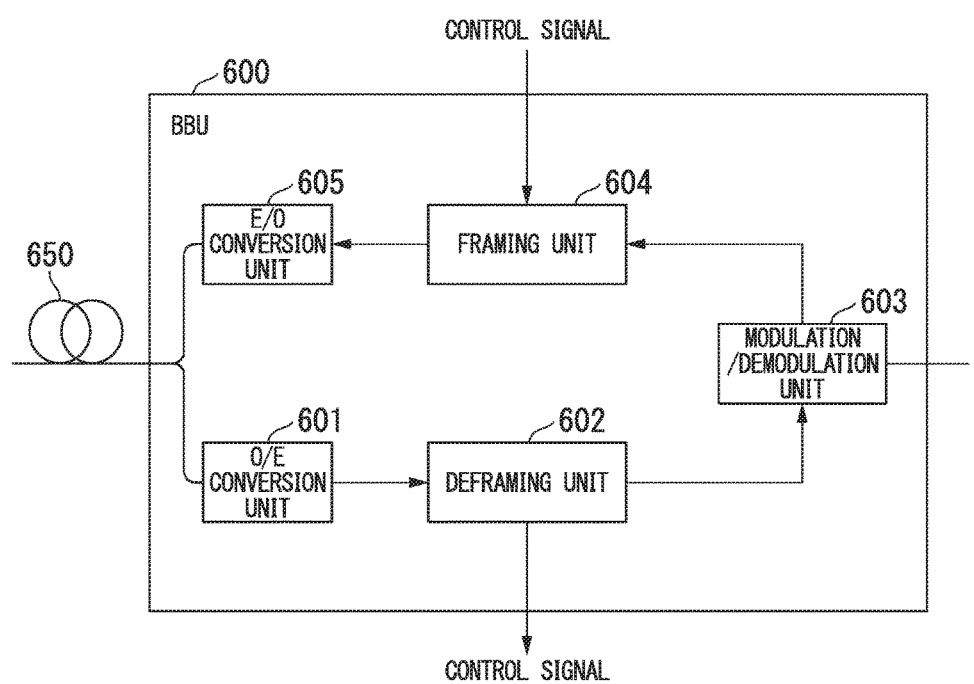
FIG. 18 is a schematic block diagram illustrating the functional structure of a BBU 600 during digital RoF transmission.
Figure 19:
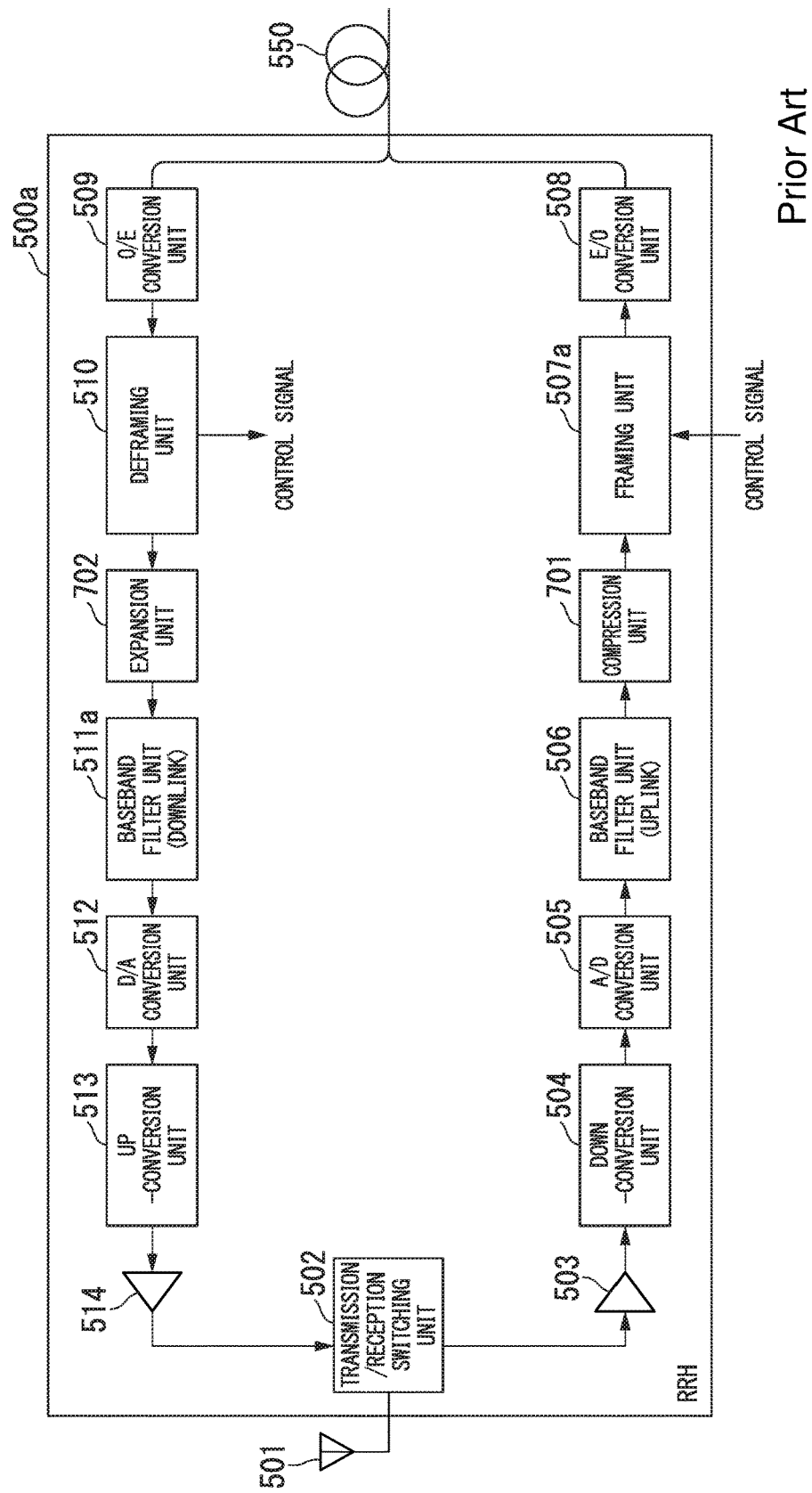
FIG. 19 is a schematic block diagram illustrating the functional structure of an RRH 500a when compression technology is incorporated during multiplexed transmission.
Figure 20:
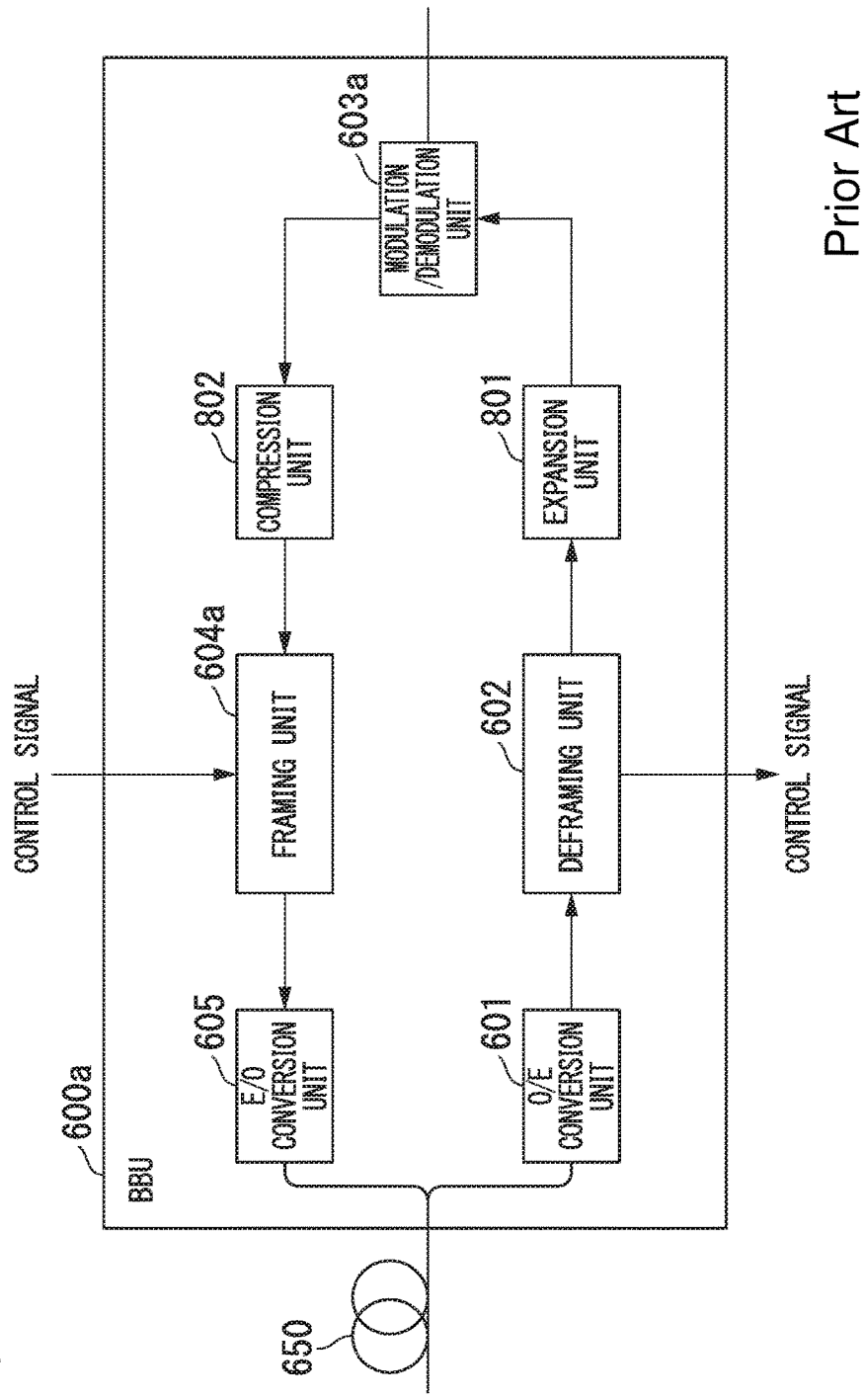
FIG. 20 is a schematic block diagram illustrating the functional structure of a BBU 600a when compression technology is incorporated during multiplexed transmission.
Figure 21:
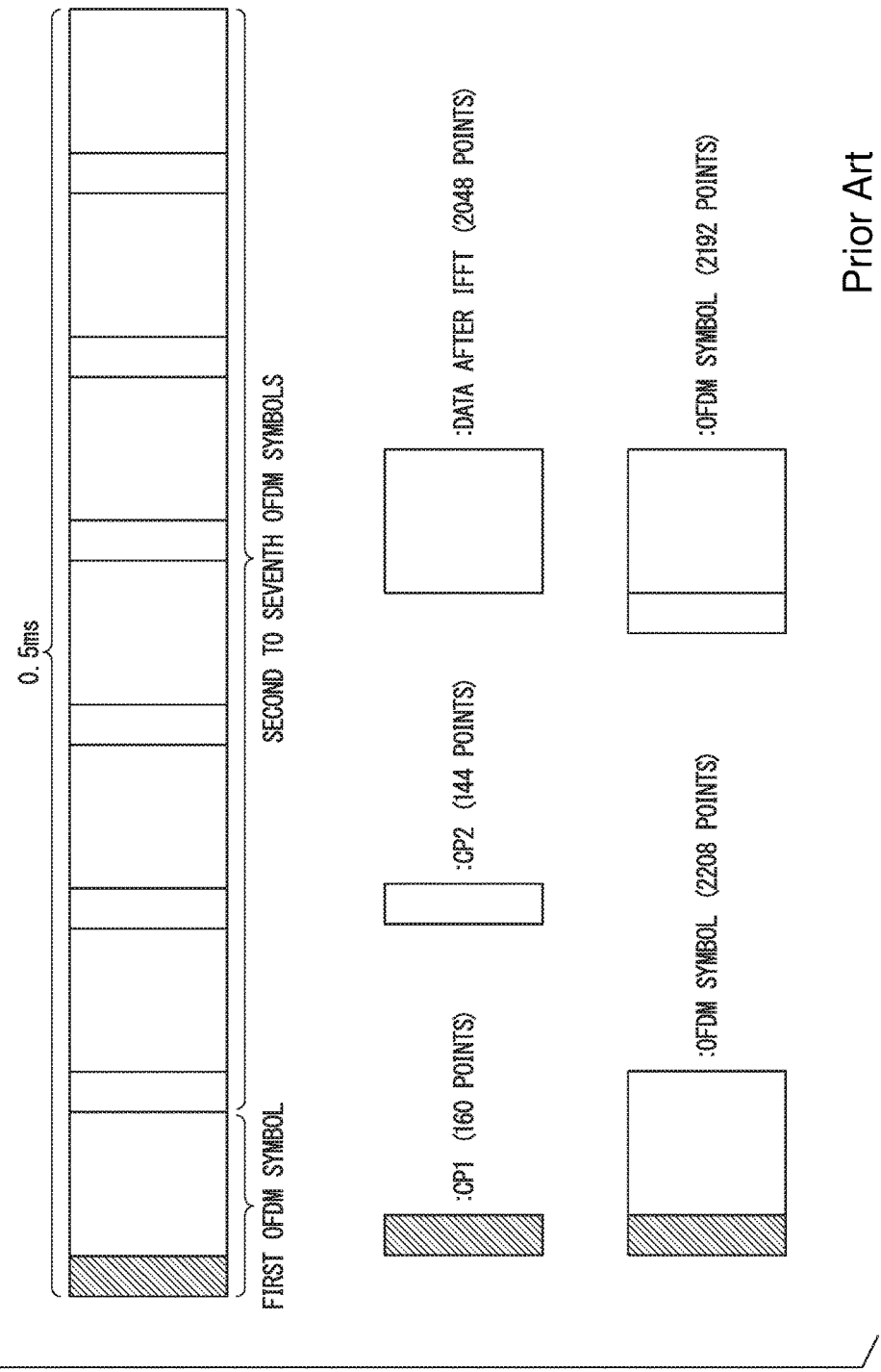
FIG. 21 is a diagram illustrating the structure of time slots in LTE.

FIG. 16 is a flow chart showing the processing flow for a downlink in the BBU 200*a* in the second embodiment. It is to be noted in FIG. 16, the processes that are the same as those in FIG. 8 will be indicated by the same reference symbols as in FIG. 8, and their explanations will be omitted.

The separation unit 213 discards a portion of the separated symbol sequence (step S801). The framing unit 210*a* generates a frame signal by multiplexing the remaining OFDM symbols compressed by the compression unit 208 with a control signal (step S802).

According to the RRH 100*a* and the BBU 200*a* configured as above, it is possible to obtain effects similar to those of the first embodiment.

Additionally, the RRH 100*a* and the BBU 200*a* discard portions of the separated symbol sequences (separated symbols) when transmitting wireless signals. Additionally, upon receiving transmitted wireless signals, the RRH 100*a* and the BBU 200*a* restore the discarded portions of the symbol sequences (separated symbols). The discarded portions of the symbol sequences can be restored because they are copies of the latter halves of the signals after IFFT output. Therefore, the RRH 100*a* and the BBU 200*a* can reduce the amount of information that is transmitted. Additionally, the RRH 100*a* and the BBU 200*a* do not need to be provided with multiplexing units for multiplexing the remaining OFDM symbols with the separated symbols, as in the first embodiment. Therefore, the worsening of the compression rate can be reduced using a simpler apparatus structure than the first embodiment. Additionally, by discarding the separated portions of the symbol sequences, the transmission band can be omitted for said portion of the symbol sequence, so the transmission band can be reduced.

Modification Example

The second embodiment may be modified in a manner similar to the first embodiment.

It is to be noted that the various above-mentioned processes relating to the processing in the RRH 100, the RRH 100*a*, the BBU 200, and the BBU 200*a* of the present invention may be performed by recording, onto a computer-readable recording medium, programs for executing the processing in the RRH 100, the RRH 100*a*, the BBU 200, and the BBU 200*a*, and reading and running the programs recorded on said recording medium on a computer system. It is to be noted that the "computer system" as referred to herein may include an OS (Operating System) and/or hardware such as peripheral devices. Additionally, the "computer system", if using a WWW (World Wide Web) system, may include a homepage-providing environment (or display environment). Additionally, "computer-readable recording medium" refers to writable non-volatile memories such as flexible disks, magneto-optic disks, ROMs (Read Only Memories), and flash memories, portable media such as CD (Compact Disc)-ROMs or the like, or memory apparatus such as hard disks that are internally provided in computer systems.

Furthermore, the "computer-readable recording medium" includes media that hold a program for a certain period of time, such as volatile memories (e.g. DRAMs (Dynamic Random Access Memories)) inside computer systems serving as servers or clients when the program is transmitted over a network such as the internet or over communication lines such as telephone lines. Additionally, the above-mentioned program may be transmitted from a computer system that stores the program in a memory apparatus or the like, to another computer system, via a transmission medium or by transmission waves in a transmission medium. In this case, the "transmission medium" that transmits the program refers to a medium having the function of transmitting information, including networks (communication networks) such as the internet or communication lines (communication cables) such as telephone lines. Additionally, the above-mentioned program may be for implementing just some of the aforementioned functions. Furthermore, the above-mentioned program may be a so-called difference file (difference program) that can be implemented by combining the aforementioned functions with a program that is already recorded in a computer system.

While embodiments of the present invention have been described in detail by referring to the drawings above, the specific structure is not limited to these embodiments, and other designs or the like within a range not departing from the gist of the present invention are included.

INDUSTRIAL APPLICABILITY

The present invention may, for example, be applied to digital RoF transmission. According to the present invention, it is possible to reduce the worsening of the compression rate.

DESCRIPTION OF REFERENCE SIGNS

100, 100*a*, 500, 500*a* RRH
200, 200*a*, 600, 600*a* BBU
101, 501 Antenna
102, 502 Transmission/reception switching unit
103, 503 Amplifier
104, 504 Down-conversion unit
105, 505 A/D conversion unit
106, 506 Baseband filter unit (uplink)
107 First separation unit
108, 108*a*, 701 Compression unit
109 First multiplexing unit
110, 110*a*, 507, 507*a* Framing unit
111, 508 E/O conversion unit
112, 509 O/E conversion unit
113, 113*a*, 510 Deframing unit
114 Second separation unit
115, 702 Expansion unit
116 Second multiplexing unit
117, 117*a*, 511, 511*a* Baseband filer unit (downlink)
118, 512 D/A conversion unit
119, 513 Up-conversion unit
120, 514 Amplifier
121 Separation unit
122 Signal restoration unit
130 Second compression unit
131 Second expansion unit
132 OFDM symbol information estimation unit
150, 250, 550, 650 Optical fiber
201, 601 O/E conversion unit
202, 202*a*, 602 Deframing unit
203 Second separation unit
204, 801 Expansion unit
205 Second multiplexing unit
206, 603, 603*a* Modulation/demodulation unit
207 First separation unit
208, 208*a*, 802 Compression unit
209 First multiplexing unit
210, 210*a*, 604, 604*a* Framing unit
211, 605 E/O conversion unit
212 Signal restoration unit
213 Separation unit
230 Second compression unit
231 Second expansion unit
232 OFDM symbol information estimation unit
1000, 1000*a*, 1000*b*, 2100, 2100*a*, 2100*b* Compression processing unit
1080, 2080 Compression rate measurement unit
1100, 1100*a*, 2000, 2000*a* Expansion processing unit

The invention claimed is:

1. An optical communication system comprising: a signal processing apparatus; and a wireless apparatus, in which functions of a base station are divided between the signal processing apparatus and the wireless apparatus, a periodic symbol sequence comprising a cyclic prefix appended to a signal of a predetermined size to which an IFFT (Inverse Fast Fourier Transform) has been applied is transmitted between the signal processing apparatus and the wireless apparatus by means of digital RoF (Radio over Fiber) transmission, the signal processing apparatus and the wireless apparatus each comprises a transmission unit and a reception unit, the transmission unit comprises:

a first separation unit that acquires symbol information relating to a starting position of the symbol sequence and lengths of symbols constituting the symbol sequence and that equalizes the lengths of the symbols by separating a portion of the symbol sequence based on the acquired symbol information; and a compression unit that compresses symbols that are to be compressed from which the separated portion of the symbol sequence has been removed, and the reception unit comprises an expansion unit that expands the compressed symbols and restores the symbols.

2. The optical communication system according to claim 1, wherein the transmission unit further comprises a first multiplexing unit that multiplexes the separated portion of the symbol sequence with the compressed symbols, and the reception unit further comprises:

a second separation unit that separates a portion of a multiplexed symbol sequence; and a second multiplexing unit that multiplexes the portion of the symbol sequence separated by the second separation unit with the symbols restored by the expansion unit.

3. The optical communication system according to claim 2, wherein the transmission unit further comprises a local symbol sequence compression unit that compresses the separated portion of the symbol sequence, and the reception unit further comprises a local symbol sequence expansion unit that expands the separated portion of the symbol sequence.

4. The optical communication system according to claim 1, wherein the first separation unit discards the separated portion of the symbol sequence, and the reception unit further comprises a signal restoration unit that restores the portion of the symbol sequence discarded by the first separation unit.

5. The optical communication system according to claim 1, wherein the compression unit comprises a compression rate measurement unit that measures a compression rate for each of the symbols, and the first separation unit acquires, as the starting position, a position of a symbol at which a predetermined statistical value of measured compression rates is smallest and equalizes the lengths of the symbols by separating a portion of the symbol sequence using the acquired starting position and information regarding the lengths of the symbols.

6. The optical communication system according to claim 1, wherein the transmission unit further comprises a symbol information estimation unit that estimates the starting position based on IQ data for a downlink or for an uplink.

7. An optical communication method in an optical communication system comprising a signal processing apparatus and a wireless apparatus between which functions of a base station are divided, the signal processing apparatus and the wireless apparatus each comprising a transmission unit and a reception unit, a periodic symbol sequence comprising a cyclic prefix appended to a signal of a predetermined size to which an IFFT (Inverse Fast Fourier Transform) has been applied being transmitted between the signal processing apparatus and the wireless apparatus by means of digital RoF (Radio over Fiber) transmission, the optical communication method comprising:

a first separation step, performed by the transmission unit, of acquiring symbol information relating to a starting position of the symbol sequence and lengths of symbols constituting the symbol sequence and equalizing the lengths of the symbols by separating a portion of the symbol sequence based on the acquired symbol information;

a compression step, performed by the transmission unit, of compressing symbols that are to be compressed from which the separated portion of the symbol sequence has been removed; and an expansion step, performed by the reception unit, of expanding the compressed symbols and restoring the symbols.

* * * * *